(12) United States Patent
Higashitsuji et al.

(10) Patent No.: US 7,709,906 B2
(45) Date of Patent: May 4, 2010

(54) SEMICONDUCTOR DEVICE AND METHOD OF FABRICATING THE SAME

(75) Inventors: Teppei Higashitsuji, Fujisawa (JP); Toshifumi Minami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 11/948,223

(22) Filed: Nov. 30, 2007

(65) Prior Publication Data

US 2008/0128795 A1 Jun. 5, 2008

(30) Foreign Application Priority Data

Nov. 30, 2006 (JP) .............................. 2006-324920

(51) Int. Cl.
*H01L 27/088* (2006.01)
(52) U.S. Cl. ...................... 257/397; 257/409; 257/396; 257/E29.016
(58) Field of Classification Search ................ 257/335, 257/337, 339, 355, 356, 394, 396, 401, 409, 257/510, 652, E29.256, E29.026, E29.027, 257/397, E29.007, E29.008, E29.015, E29.016, 257/327
See application file for complete search history.

(56) References Cited

U.S. PATENT DOCUMENTS

| | | | | |
|---|---|---|---|---|
| 4,478,655 A | * | 10/1984 | Nagakubo et al. ........... | 438/151 |
| 5,877,044 A | * | 3/1999 | Neilson et al. .............. | 438/138 |
| 7,061,029 B1 | * | 6/2006 | Lee et al. ..................... | 257/213 |
| 7,394,137 B2 | * | 7/2008 | Hayashi et al. ............. | 257/409 |
| 2002/0130384 A1 | * | 9/2002 | Aton .......................... | 257/510 |
| 2003/0030113 A1 | * | 2/2003 | Nishibe et al. .............. | 257/401 |
| 2005/0062104 A1 | * | 3/2005 | Kim et al. ................... | 257/339 |
| 2006/0270182 A1 | | 11/2006 | Akiba et al. | |

FOREIGN PATENT DOCUMENTS

| | | |
|---|---|---|
| JP | 2-67765 | 3/1990 |
| JP | 6-177376 | 6/1994 |
| KR | 10-0195369 | 6/1999 |
| KR | 10-2007-0028932 | 3/2007 |

* cited by examiner

*Primary Examiner*—Victor A Mandala
*Assistant Examiner*—Scott Stowe
(74) *Attorney, Agent, or Firm*—Oblon, Spivak, McClelland, Maier & Neustadt, L.L.P.

(57) ABSTRACT

A semiconductor device includes a gate insulation film provided on a semiconductor substrate, a gate electrode provided on the gate insulation film, a pair of first diffusion layers, a pair of second diffusion layers which are provided in the semiconductor substrate in such a manner that the gate electrode is interposed between the second diffusion layers, the second diffusion layers have a lower impurity concentration than the first diffusion layers, contact wiring lines provided on the first diffusion layers, respectively, and a first insulation layer which is an insulation layer formed in at least one of the second diffusion layers between the gate electrode and the contact wiring lines, the first insulation layer having a greater depth in the semiconductor substrate than the first diffusion layer and a less depth than the second diffusion layer.

9 Claims, 19 Drawing Sheets

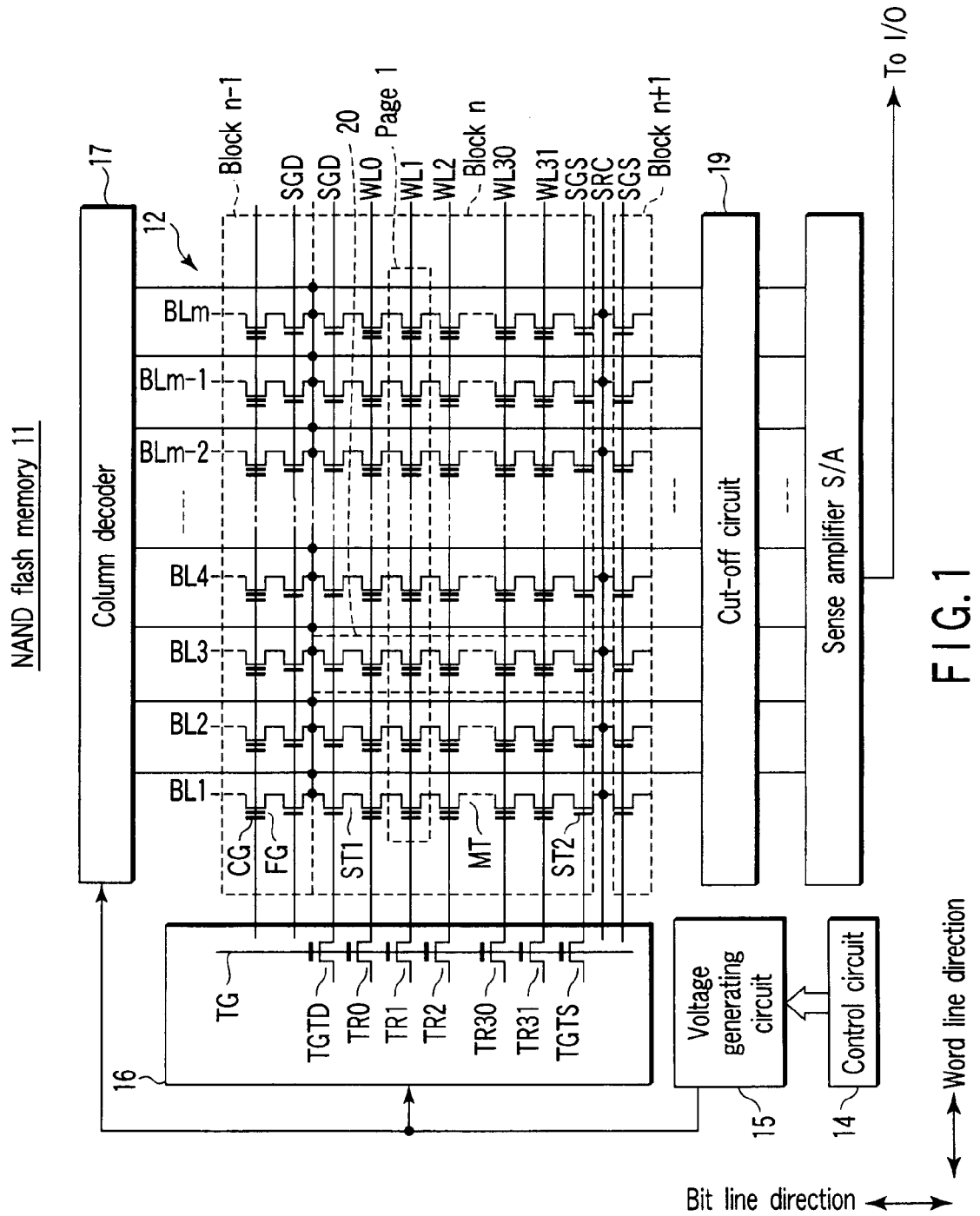
F I G. 1

Example of voltage transfer operation (at time of write operation)

Example of voltage transfer operation (at time of write operation)

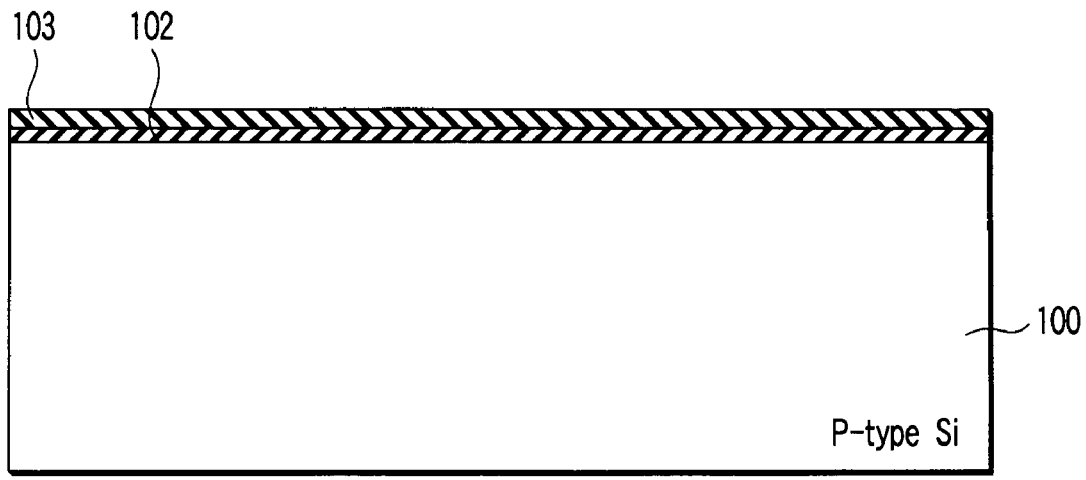
F I G. 11
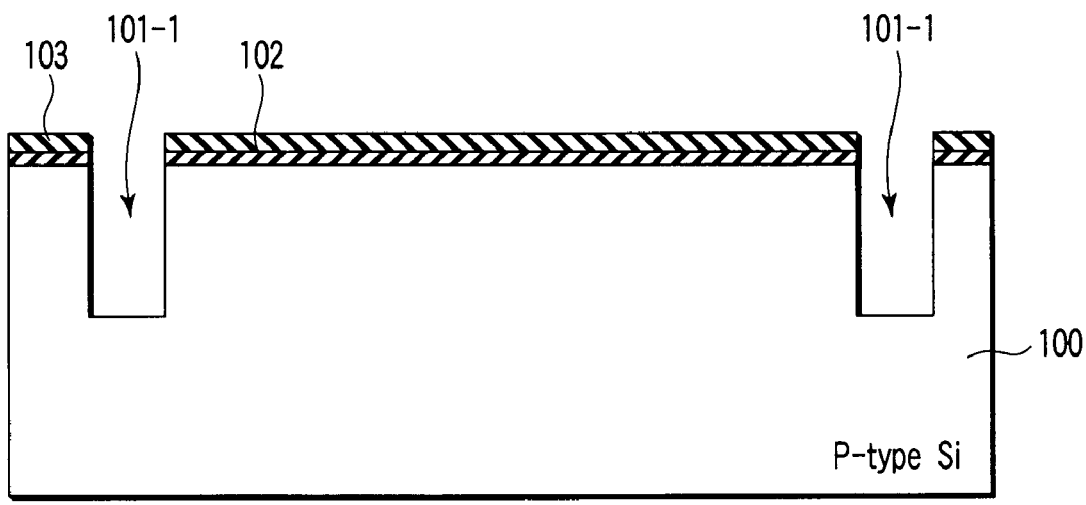
F I G. 12

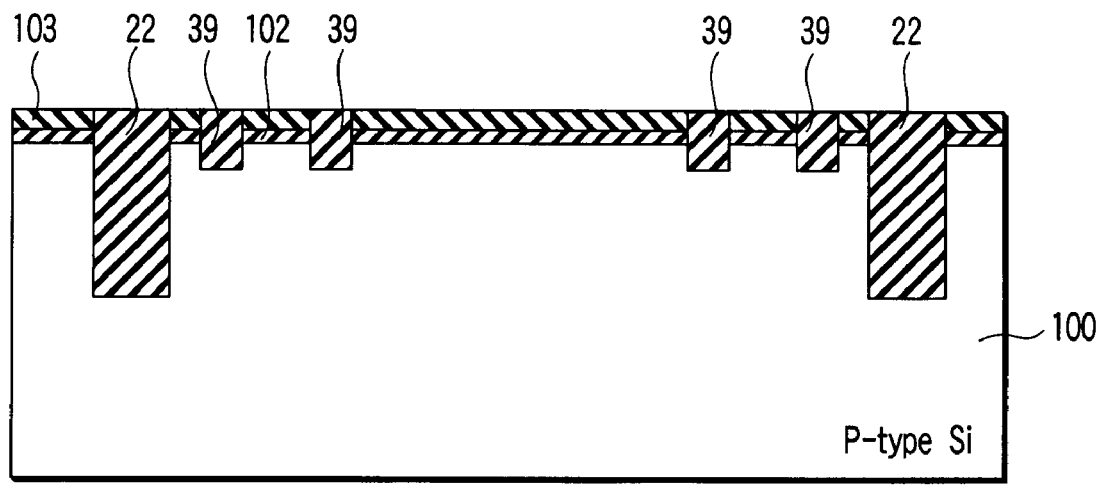
F I G. 15
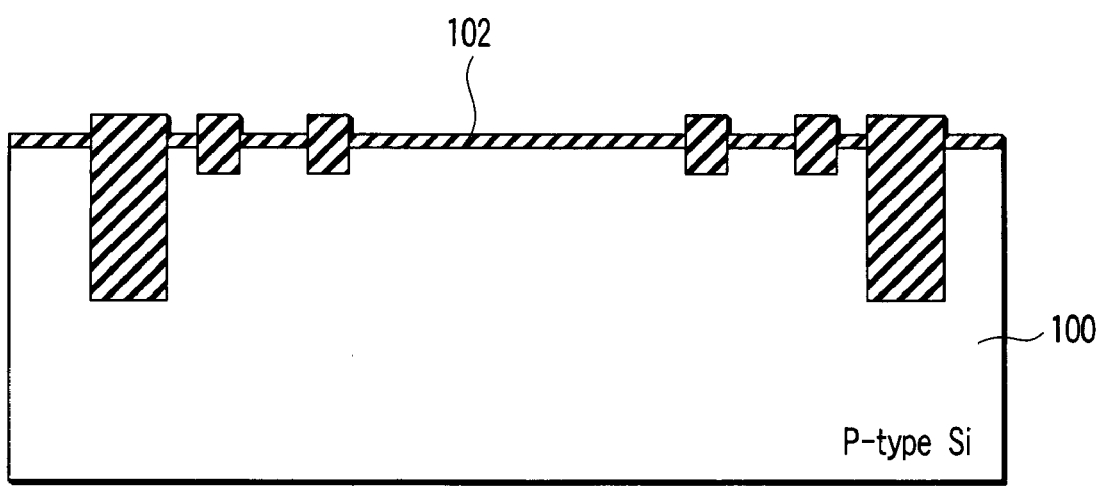
F I G. 16

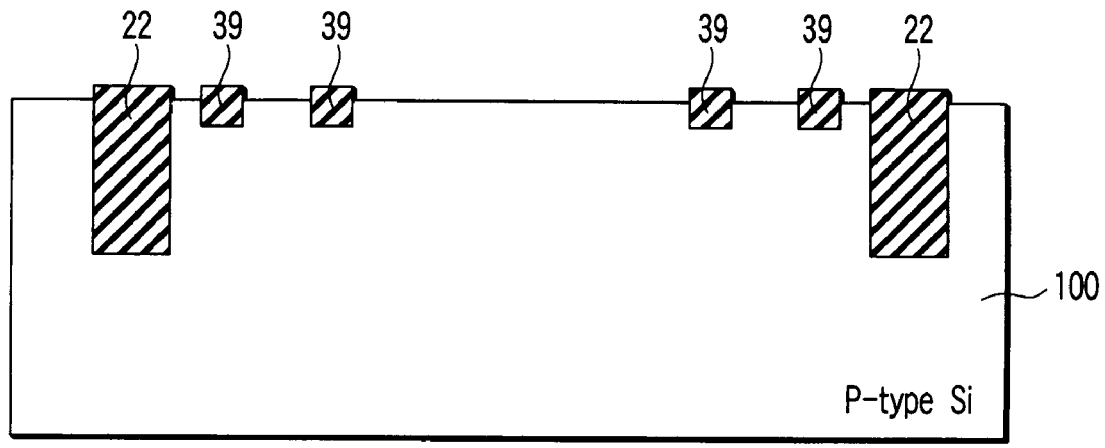
F I G. 17
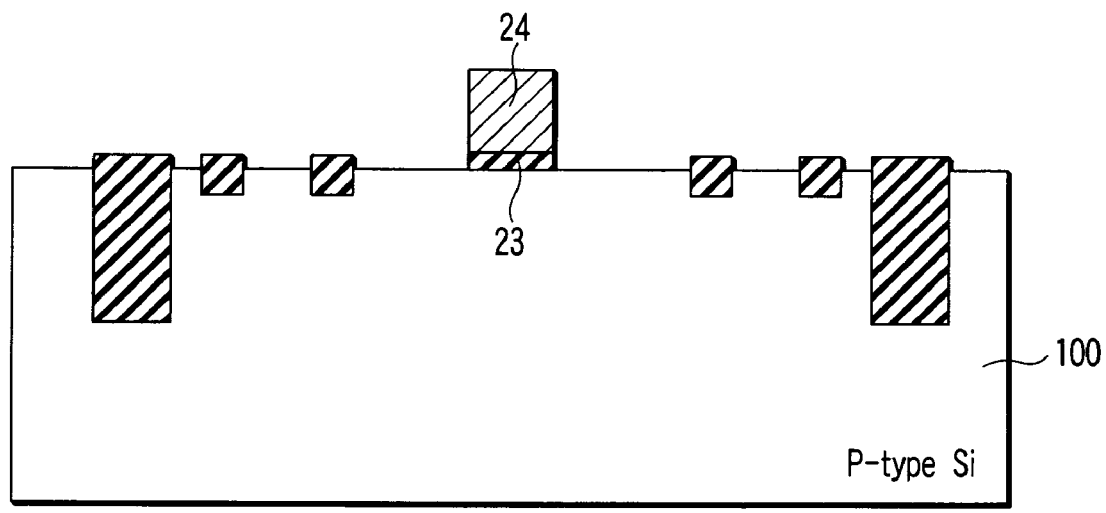
F I G. 18

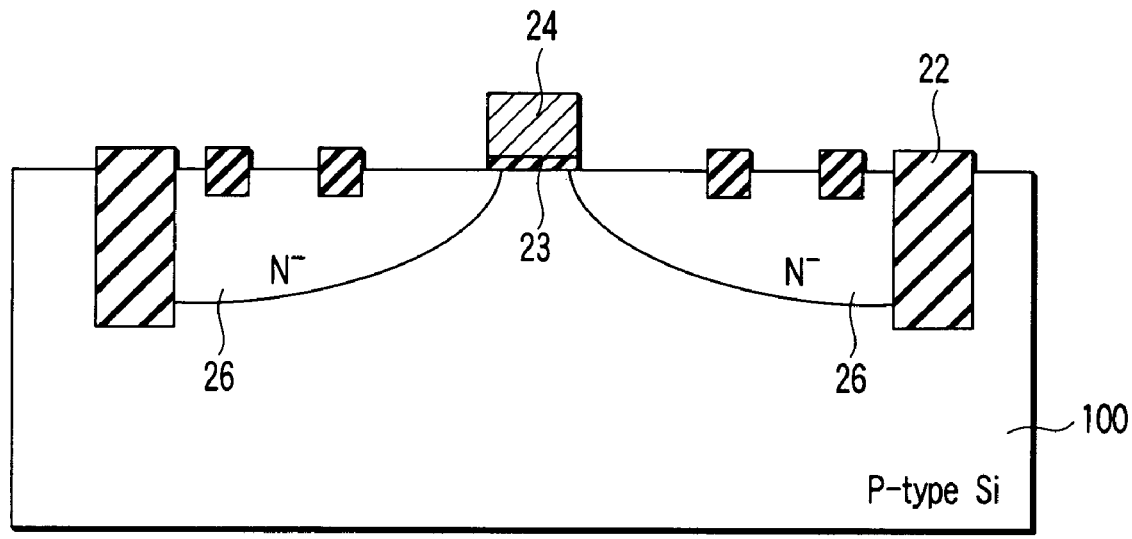
F I G. 19
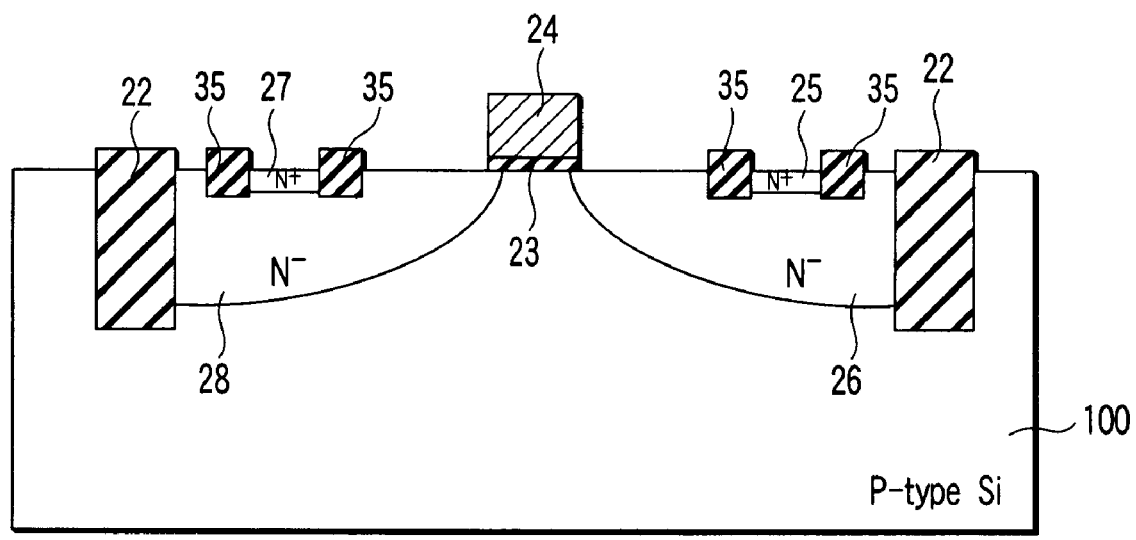
F I G. 20

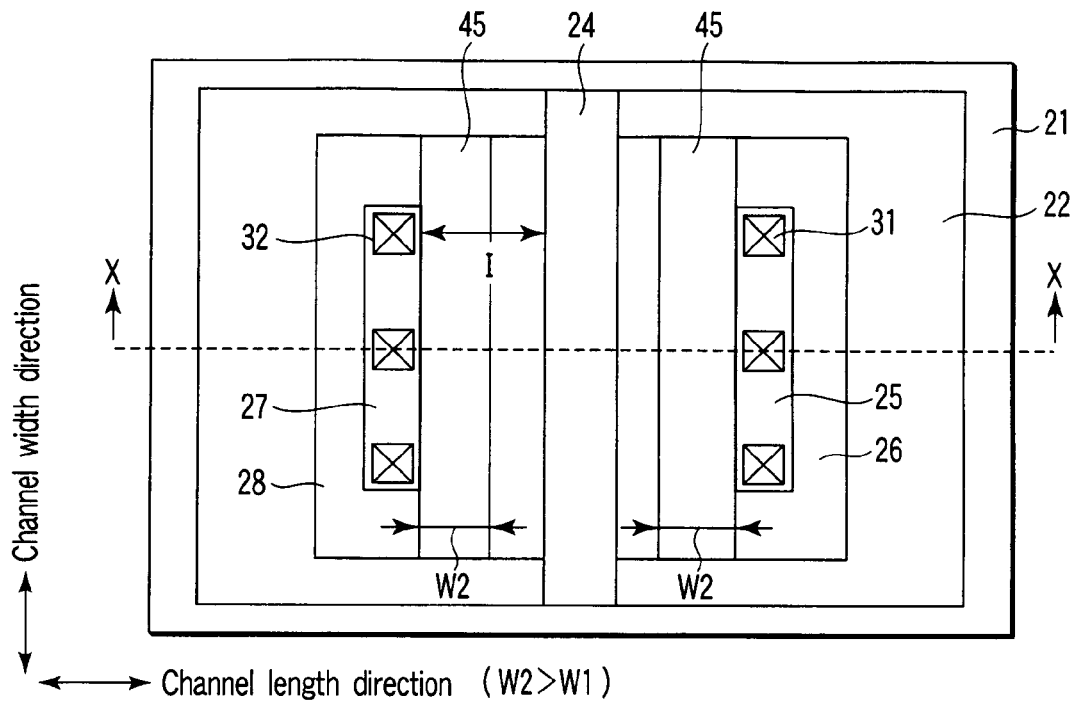
F I G. 25
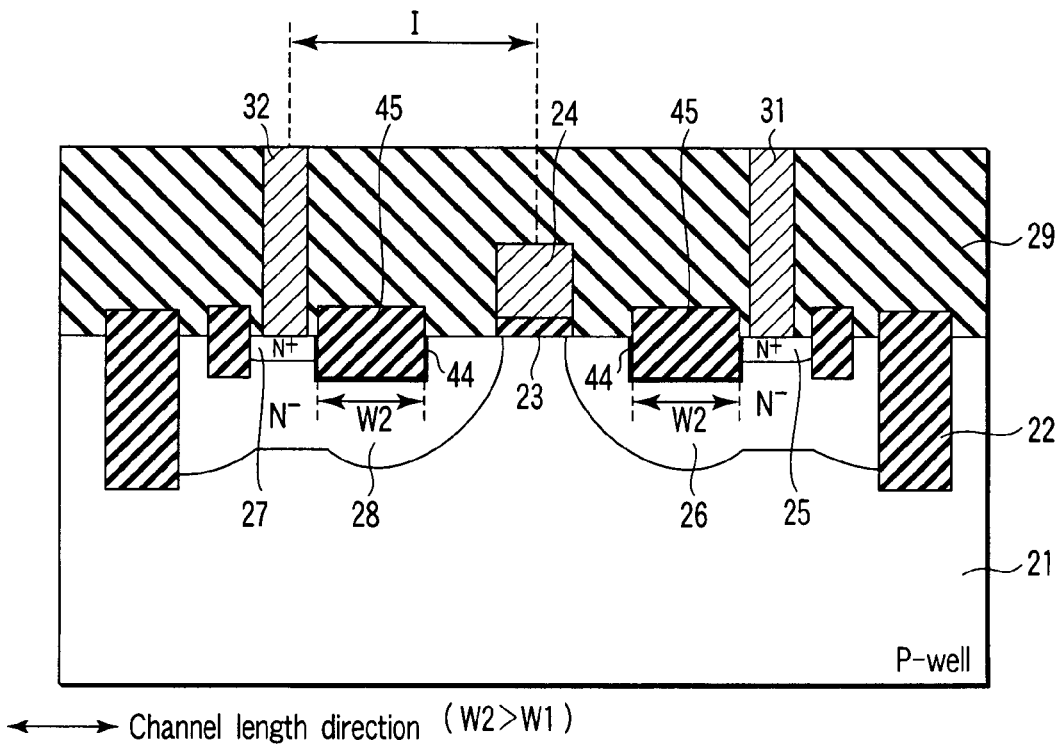
F I G. 26

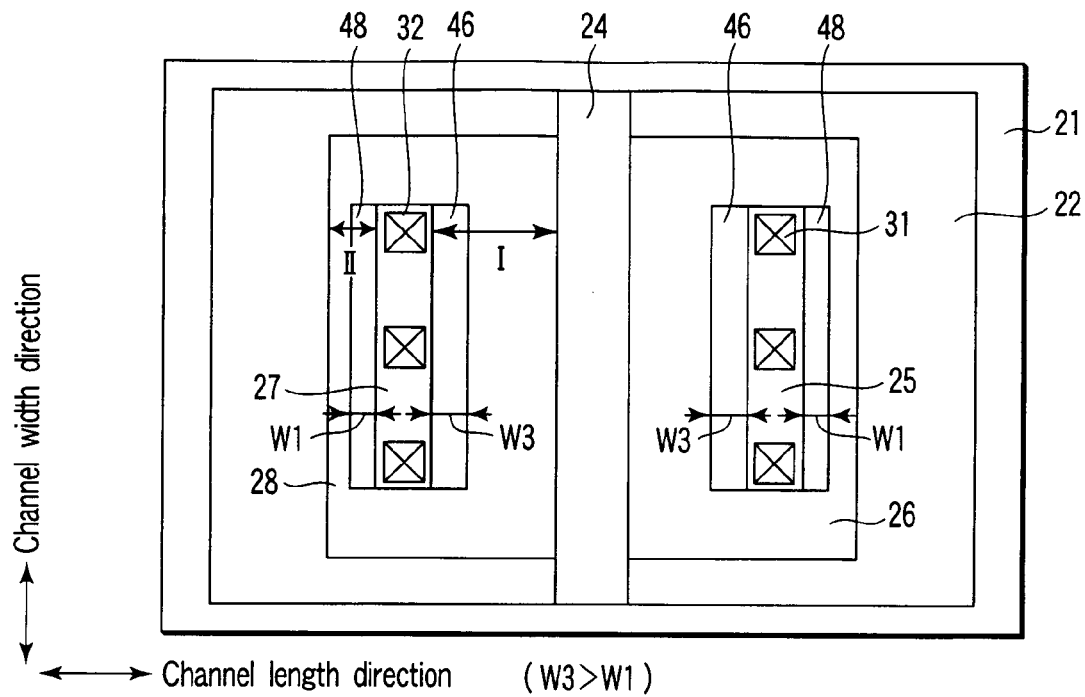
F I G. 29
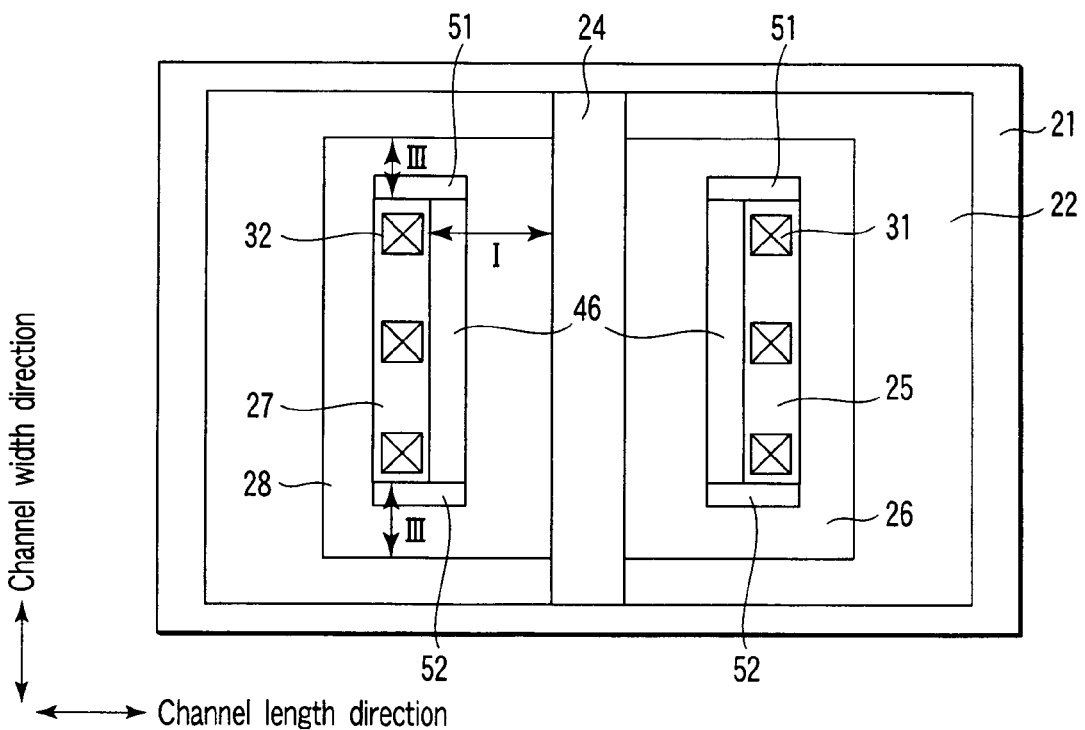
F I G. 30

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2006-324920, filed Nov. 30, 2006, the entire contents of which are incorporated herein by reference.

BACKGROUND OF THE INVENTION

1. Field of the Invention

The present invention relates to a semiconductor device and a method of fabricating the semiconductor device, and is applied, for example, to a high-breakdown-voltage transistor.

2. Description of the Related Art

In recent years, in order to realize high integration density and low cost, semiconductor devices, such as NAND flash memories, are configured such that a contact cell is not provided for each bit. Owing to this configuration, a memory cell region is excessively small. The density of the memory cell region has been increasing, as the generation of processing technology progresses.

On the other hand, in fact, the operation voltages of the NAND flash memory, such as write, erase and read voltages, have not been decreasing with the progress of the generation progresses. The reason is as follows. In a write operation of the NAND flash memory, a high voltage of, e.g. about 15 V to 30 V, is applied to the word line (gate) and the bit line (drain). Electrons, which occur near the drain, become able to tunnel a potential barrier, and electrons flow into the floating gate. Thus, the threshold voltage for the electric current needs to be increased.

The write/erase/read voltages are transferred from high-breakdown-voltage transistors in peripheral circuits (circuits for amplification/boost) which are provided in the vicinity of the memory cell array and control high voltages. Since high voltages due to such operation voltages are applied to the high-breakdown-voltage transistors, it is necessary to secure such an occupation area as to maintain a surface breakdown voltage and a junction breakdown voltage.

Thus, if the surface breakdown voltage and junction breakdown voltage are to be improved, there is a tendency that the occupation area increases, and this is disadvantageous for microfabrication.

As described above, in the conventional semiconductor device and the fabrication method thereof, if the surface breakdown voltage and junction breakdown voltage are to be maintained, there is a tendency that the occupation area increases, and this is disadvantageous for microfabrication.

Jpn. Pat. Appln. KOKAI Publication No. H02-67765, for instance, discloses a semiconductor device including a high-breakdown-voltage MOS transistor.

BRIEF SUMMARY OF THE INVENTION

According to an aspect of the present invention, there is provided a semiconductor device comprising: a gate insulation film provided on a semiconductor substrate; a gate electrode provided on the gate insulation film; a pair of first diffusion layers which are provided in the semiconductor substrate in such a manner that the gate electrode is interposed between, and spaced apart from, the first diffusion layers; a pair of second diffusion layers which are provided in the semiconductor substrate in such a manner that the gate electrode is interposed between the second diffusion layers, the second diffusion layers being provided in such a manner as to surround the first diffusion layers, respectively, and each of the second diffusion layers being formed to have a greater depth from a surface of the semiconductor substrate than the first diffusion layers and to have a lower impurity concentration than the first diffusion layers; contact wiring lines provided on the first diffusion layers, respectively; a first insulation layer which is an insulation layer formed in at least one of the second diffusion layers between the gate electrode and the contact wiring lines, the first insulation layer having a greater depth in the semiconductor substrate than the first diffusion layer and a less depth than the second diffusion layer; and a second insulation layer which is an insulation layer formed in the second diffusion layer in such a manner that the first diffusion layer is interposed between the first insulation layer and the second insulation layer, the second insulation layer having a greater depth in the semiconductor substrate than the second diffusion layer.

According to another aspect of the present invention, there is provided a semiconductor device comprising: a gate insulation film provided on a semiconductor substrate; a gate electrode provided on the gate insulation film; a pair of first diffusion layers which are provided in the semiconductor substrate in such a manner that the gate electrode is interposed between, and spaced apart from, the first diffusion layers; a pair of second diffusion layers which are provided in the semiconductor substrate in such a manner that the gate electrode is interposed between the second diffusion layers, the second diffusion layers being provided in such a manner as to surround the first diffusion layers, respectively, and each of the second diffusion layers being formed to have a greater depth from a surface of the semiconductor substrate than the first diffusion layers and to have a lower impurity concentration than the first diffusion layers; contact wiring lines provided on the first diffusion layers, respectively; and a first insulation layer which is an insulation layer formed in at least one of the second diffusion layers between the gate electrode and the contact wiring lines, the first insulation layer having a greater depth in the semiconductor substrate than the first diffusion layer and a less depth than the second diffusion layer; and a second insulation layer which is an insulation layer formed in at least one of the second diffusion layers between the gate electrode and the first insulation layers, the second insulation layer having a greater depth in the semiconductor substrate than the first diffusion layer and a less depth than the second diffusion layer.

According to another aspect of the present invention, there is provided a semiconductor device comprising: a semiconductor substrate including device isolation regions and a device region which is isolated by the device isolation regions; device isolation insulation films buried in the semiconductor substrate in the device isolation regions; a gate insulation film provided on the semiconductor substrate in the device region; a gate electrode provided on the gate insulation film; source/drain diffusion layers which are formed in the semiconductor substrate from regions corresponding to side end portions of the gate electrode to regions contacting side end portions of the device isolation insulation films; high-concentration diffusion layers which are formed such that the high-concentration diffusion layers are surrounded by the source/drain diffusion layers, an impurity concentration of each of the high-concentration diffusion layers being higher than an impurity concentration of the source/drain diffusion layer, and a depth of each of the high-concentration diffusion layers from a surface of the semiconductor substrate being less than a depth of the source/drain diffusion layer; contact wiring lines provided on the semiconductor substrate in which the high-concentration diffusion layers are formed; a first insulation layer which is an insulation layer buried in the semiconductor substrate between the contact wiring line and the gate electrode, a depth of the first insulation layer from the surface of the semiconductor substrate being less than a depth of the source/drain diffusion layer and greater than a depth of the high-concentration diffusion layer, wherein the device isolation insulation films have a greater depth in the semiconductor substrate than the source/drain diffusion layers.

According to still another aspect of the present invention, there is provided a method of fabricating a semiconductor device, comprising: forming a first trench for device isolation in a semiconductor substrate; forming a second trench at a position shallower than the first trench in the semiconductor substrate in at least one of ranges between a gate electrode formation position and contact wiring line formation positions; burying insulation layers in the first trench and the second trench, thus forming a device isolation insulation film and an insulation layer; forming a gate insulation film on the semiconductor substrate; forming a gate electrode on the gate insulation film; forming, by using the gate electrode as a mask, a pair of first diffusion layers at a position shallower than the device isolation insulation film and deeper than the insulation layer in the semiconductor substrate, in such a manner that the gate electrode is interposed between, and spaced apart from, the first diffusion layers; a pair of second diffusion layers at the contact wiring line formation positions of the semiconductor substrate at a position shallower than the insulation layer in the semiconductor substrate, the pair of second diffusion layers having a higher impurity concentration than the pair of first diffusion layers; and forming contact wiring lines on the pair of second diffusion layers.

BRIEF DESCRIPTION OF THE SEVERAL VIEWS OF THE DRAWING

FIG. 1 is a block diagram showing a semiconductor device according to a first embodiment of the present invention;

FIG. 11 is a cross-sectional view illustrating a fabrication step of the semiconductor device according to the third embodiment;

FIG. 12 is a cross-sectional view illustrating a fabrication step of the semiconductor device according to the third embodiment;

FIG. 15 is a cross-sectional view illustrating a fabrication step of the semiconductor device according to the third embodiment;

FIG. 16 is a cross-sectional view illustrating a fabrication step of the semiconductor device according to the third embodiment;

FIG. 17 is a cross-sectional view illustrating a fabrication step of the semiconductor device according to the third embodiment;

FIG. 18 is a cross-sectional view illustrating a fabrication step of the semiconductor device according to the third embodiment;

FIG. 19 is a cross-sectional view illustrating a fabrication step of the semiconductor device according to the third embodiment;

FIG. 20 is a cross-sectional view illustrating a fabrication step of the semiconductor device according to the third embodiment;

FIG. 25 is a plan view showing a semiconductor device according to a sixth embodiment of the invention;

FIG. 26 is a cross-sectional view taken along line X-X in FIG. 25;

FIG. 29 is a plan view showing a semiconductor device according to a ninth embodiment of the invention;

FIG. 30 is a plan view showing a semiconductor device according to a tenth embodiment of the invention;

DETAILED DESCRIPTION OF THE INVENTION

Figure 2:
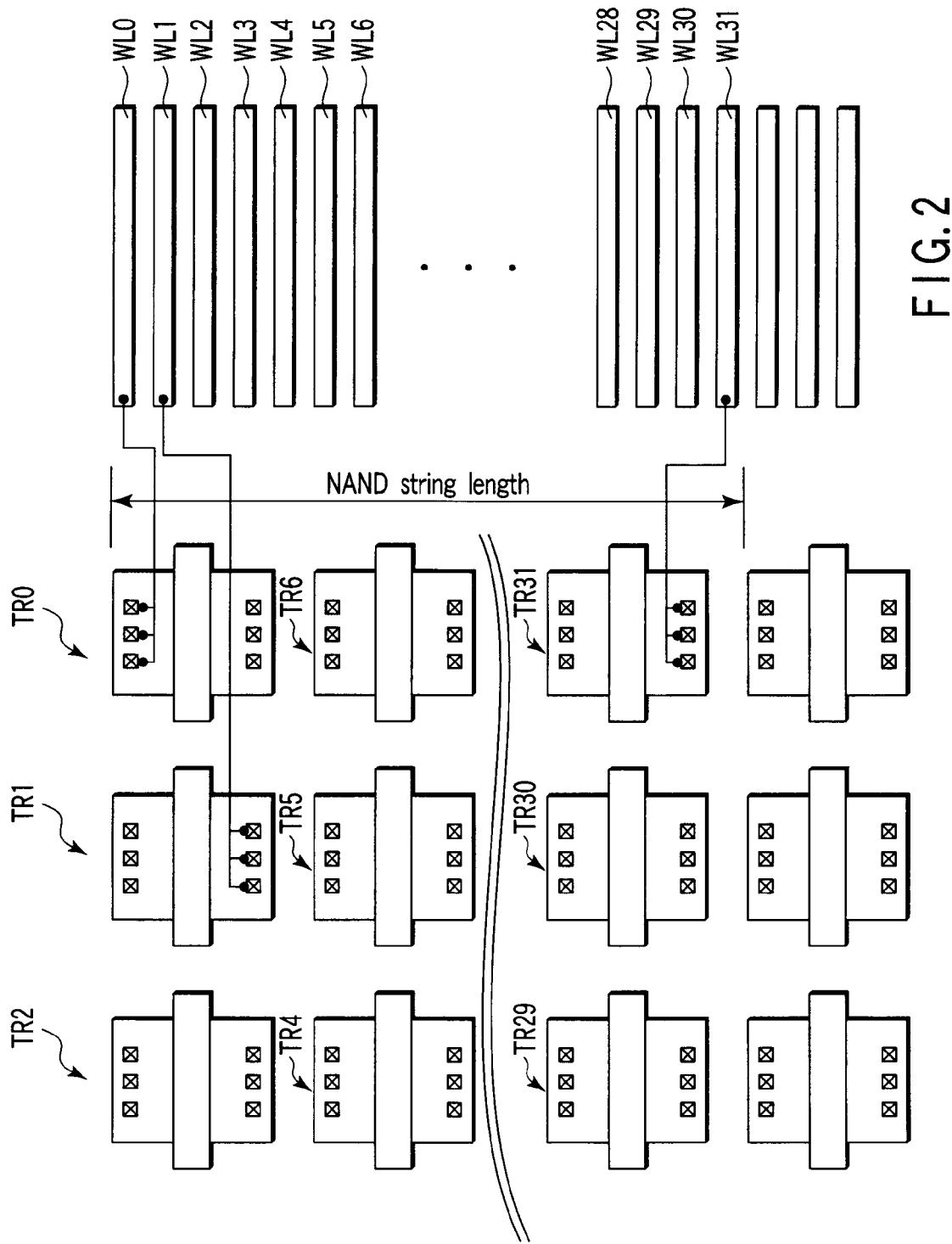
FIG. 2 is a plan view for describing a row decoder in FIG. 1.

Embodiments of the present invention will now be described with reference to the accompanying drawings. In the description below, common parts are denoted by like reference numerals throughout the specification.

First Embodiment

To begin with, a semiconductor device according to a first embodiment of the invention is described with reference to FIG. 1 to FIG. 4. In this embodiment, a NAND flash memory is exemplified as the semiconductor device.

<1. Example of the Structure of the NAND Flash Memory>

FIG. 1 is a block diagram showing the NAND flash memory according to the present embodiment. As shown in FIG. 1, the NAND flash memory 11 according to this embodiment includes a memory cell array 12, a control circuit 14, a voltage generating circuit 15, a row decoder 16, a column decoder 17, a cut-off circuit 19 and a sense amplifier S/A.

The voltage generating circuit 15 is configured to generate voltages of predetermined values, for example, a write voltage Vpgm, an erase voltage Vera and a read voltage Vread.

The control circuit 14 is configured to control the voltage generating circuit 15.

The memory cell array 12 is composed of a plurality of blocks ( . . . , Block n−1, Block n, Block n+1, . . . ). For example, the plural blocks ( . . . , Block n−1, Block n, Block n+1, . . . ) are a single-level NAND flash memory which is configured as an SLC (Single Level Cell) region that is capable of recording 1-bit data in one memory cell transistor MT. Alternatively, the plural blocks may be a multilevel NAND flash memory which is configured as an MLC (Multi Level Cell) region that is capable of recording multi-bit data in one memory cell transistor MT.

The block (Block n) includes a plurality of memory cell transistors MT which are arranged in a matrix at intersections between, for example, 32 word lines WL0 to WL31 and an m-number of bit lines BL1 to BLm.

Each of the memory cell transistors MT has a stacked structure comprising a tunnel insulation film provided on a semiconductor substrate (e.g. P-type silicon substrate); a floating electrode FG provided on the tunnel insulation film; an inter-gate insulation film provided on the floating electrode FG; and a control electrode CG provided on the inter-gate insulation film. Memory cell transistors MT, which neighbor in the direction of the bit line BL, have their sources/drains shared as their current paths. The current paths are connected in series at one end and the other end. In this example, 32 memory cell transistors are connected in series.

A NAND string 20 is composed of the memory cell transistors MT, which have their current paths connected in series at one end and the other end, and select transistors ST1 and ST2. The NAND string 20 is selected by the select transistors ST1 and ST2. One end of the current path of the NAND string 20 is connected to the sense amplifier S/A via the cut-off circuit 19, and the other end of the current path is connected to a source line SRC.

The number of memory cell transistors MT is not limited to 32, and may be 8, 16 or more, for instance. In addition, only one of the select transistors ST1 and ST2 may be provided if the select transistor is configured to be able to select the NAND string 20.

The control electrodes CG of the memory cell transistors MT in the direction of the word line WL are commonly connected to an associated one of the word lines WL0 to WL31. The gates of the select transistors ST1 are commonly connected to a select gate SGD, and the gates of the select transistors ST2 are commonly connected to a select gate SGS. The drain of the select transistor ST1 is connected to one of the bit lines BL1 to BLm. The source of the select transistor ST2 is connected to a source line SRC.

As indicated by a broken line in FIG. 1, one page (PAGE) is present in association with each of the word lines WL0 to WL31 in the direction of the word lines WL. For example, a page (PAGE 1) is present in association with the word line WL1. One page includes a data region (e.g. about 512 Bytes) for storing data, etc., and a redundant region (e.g. about 16 Bytes). The redundant region includes, e.g. an ECC (Error Correcting Code) region (e.g. about 3 Bytes).

Since a write operation and a read operation are executed in units of the page, the page is a unit of data write and data read. An erase operation is executed batchwise in units of the block (Block n) by applying an erase voltage Vera to all control electrodes CG and releasing electrons from the floating gates FG.

The row decoder 16 is configured to select word lines WL0 to WL31 and select gate lines SGD and SGS in accordance with addresses which are designated from a memory controller (not shown). The row decoder 16 includes transfer gate transistors TGTD and TGTS and transfer transistors TR0 to TR31, which have gates commonly connected to a transfer gate line TG. The transfer transistors TR0 to TR31 are high-breakdown-voltage (high-voltage (HV)) transistors which are configured to transfer predetermined voltages, such as an erase voltage Vera and a write voltage Vpgm, to control electrodes CG of memory cell transistors MT.

The sense amplifier S/A is configured to amplify data of each page which is read out of bit lines BL1 to BLm. For example, the sense amplifier S/A is composed of a plurality of latch circuits having inputs connected to the bit lines BL1 to BLm and outputs connected to an output terminal (I/O).

The cut-off circuit 19 is disposed on the current path between the memory cell array 12 and sense amplifier S/A, and is configured to cut off the current path between the memory cell array 12 and sense amplifier S/A.

<2. Example of the Structure of the Transfer Transistor>

Next, an example of the structure of the transfer transistor in the present embodiment is described with reference to FIG. 2 to FIG. 4. To begin with, an example of arrangement of transfer transistors is described with reference to FIG. 2. FIG. 2 is a plan view showing transfer transistors TR0 to TR31.

As shown in FIG. 2, a plurality of transfer transistors TR0 to TR31 are arranged in a matrix in the row decoder 16. In this example, the transfer transistors TR0 to TR31 are arranged such that the number of arranged transfer transistors TR0 to TR31 takes a maximum value within the length of one NAND string 20 (i.e. the unit of cell word lines WL interposed between the control electrodes CG) in the vertical direction (bit line direction) of the sheet surface of FIG. 2. It is thus understood that the chip size can be reduced by minimizing the number of arranged transfer transistors TR0 to TR31 in the horizontal direction (word line direction).

Figure 3:
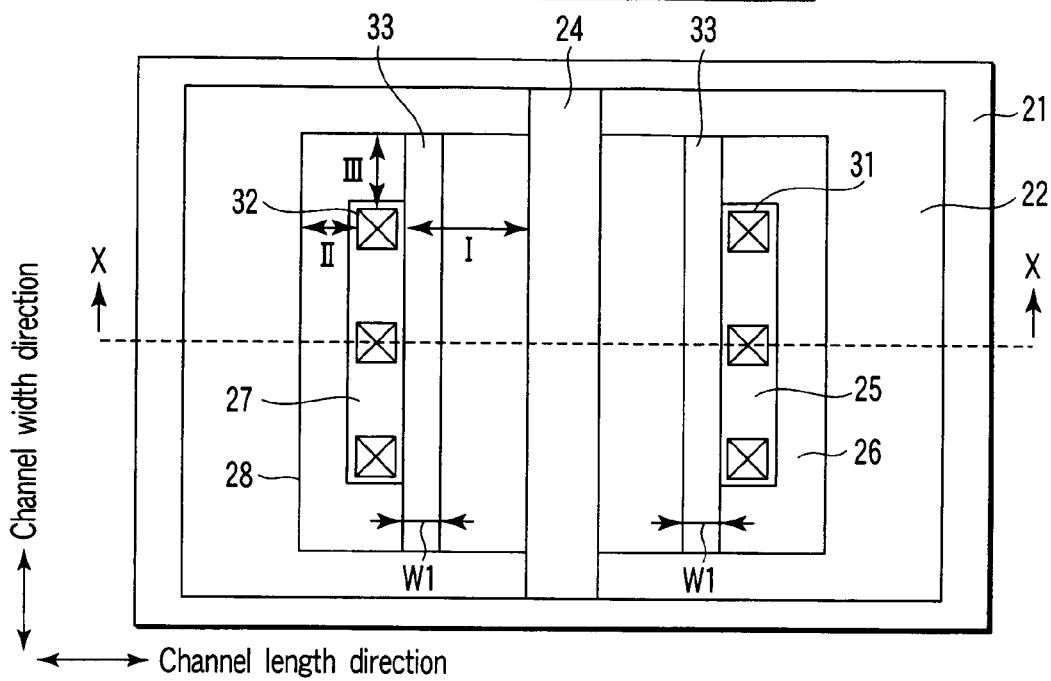
FIG. 3 is a plan view showing a transfer transistor in FIG. 2.
Figure 4:
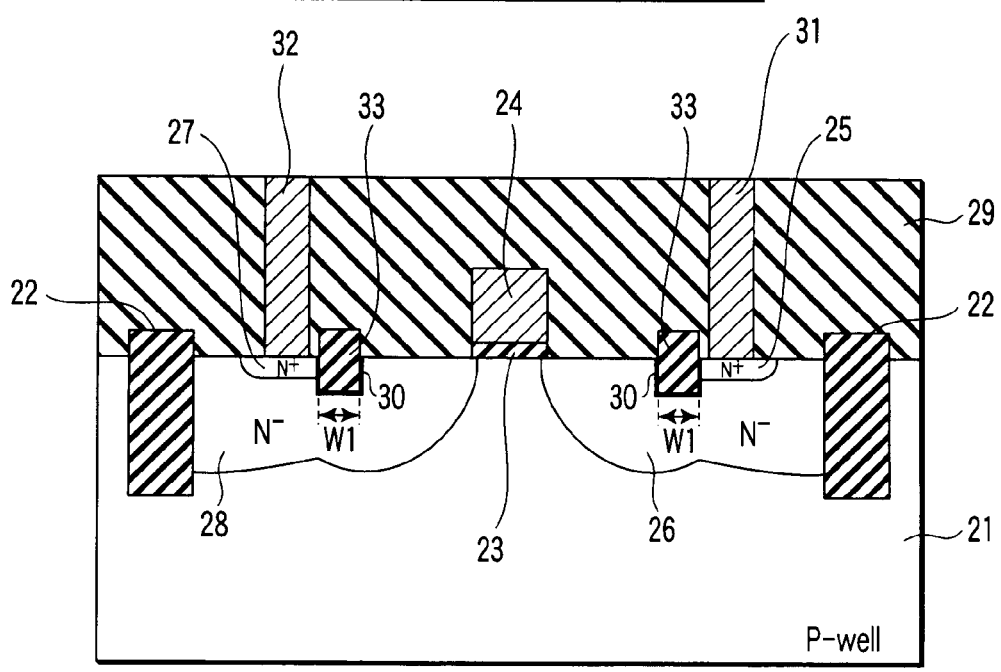
FIG. 4 is a cross-sectional view taken along line X-X in FIG. 3.

Next, referring to FIG. 3 and FIG. 4, an example of the plan-view structure and cross-sectional structure of each transfer transistor is described. The transfer transistor TR0 is described by way of example. FIG. 3 shows the plan-view structure of the transfer transistor TR0, and FIG. 4 is a cross-sectional view taken along line X-X in FIG. 3.

As shown in FIG. 3 and FIG. 4, the transfer transistor TR0 is provided on a P-type well (P-well) 21 of a device region of a semiconductor substrate, which is isolated by device isolation insulation films 22. The transfer transistor TR0 includes a gate insulation film 23, a gate electrode 24, diffusion layers (first diffusion layers) 25 and 27, diffusion layers (second diffusion layers) 26 and 28 functioning as a source and a drain, contact wiring lines 31 and 32, and insulation layers 33.

The gate electrode 24 is provided on the gate insulation film 23 and is formed of, e.g. polysilicon.

The diffusion layers ($N^+$ layers (high-concentration diffusion layers)) 25 and 27 are a pair of high-concentration diffusion layers which are provided in the P-type well 21 so as to sandwich the gate electrode 24 and to be spaced apart from the gate electrode 24, and which are provided in order to improve the junction breakdown voltage between the diffusion layers ($N^−$ layers) 26 and 28. The diffusion layers 25 and 27 are formed by being doped with N-type impurities such as phosphorus (P) or arsenic (As).

In other words, the high-concentration diffusion layers 25 and 27 are a pair of diffusion layers which are formed such that the diffusion layers 25 and 27 are surrounded by the source/drain diffusion layers 26 and 28, the impurity concentration in the diffusion layers 25 and 27 is higher than that in the source/drain diffusion layers 26 and 28, and the depth of the diffusion layers 25 and 27 from the surface of the semiconductor substrate 21 is less than the depth of the source/drain diffusion layers 26 and 28.

The diffusion layers ($N^−$ layers (source/drain diffusion layers)) 26 and 28 are a pair of source/drain diffusion layers functioning as the source/drain of the transfer transistor TR0. The source/drain diffusion layers 26 and 28 are provided in the P-type well 21 so as to sandwich the gate electrode 24 at a position deeper than the diffusion layers ($N^+$ layers) 25 and 27, and the concentration of N-type impurities, such as phosphorus (P), in the source/drain diffusion layers 26 and 28 is lower than that in the diffusion layers (N+ layers) 25 and 27.

In other words, the source/drain diffusion layers 26 and 28 are a pair of diffusion layers which are formed in the semiconductor substrate 21 so as to extend from regions corresponding to side end portions of the gate electrode 24 to regions contacting side end portions of the device isolation insulation films 22.

The contact wiring lines 31 and 32 are provided on the diffusion layers (N+ layers) 25 and 27 in order to apply predetermined voltages to the source/drain.

The insulation layers 33 are provided so as to have a greater depth in the P-type well 21 than the diffusion layers (N+ layers) 25 and 27 and to have a less depth in the P-type well 21 than the diffusion layers (N− layers) 26 and 28, and are provided in trenches 30 which are disposed in the channel length direction between the gate electrode 24 and the contact wiring line 31, 32. In other words, the insulation layer 33 is an insulation layer which is formed at least on one side of the gate electrode 24 in that part of the semiconductor substrate 21, where the diffusion layer 26, 28 is formed between the gate electrode 24 and the contact wiring line 31, 32, and the insulation layer 33 has a greater depth in the semiconductor substrate 21 than the diffusion layer 25, 27 and has a less depth in the semiconductor substrate 21 than the diffusion layer 26, 28.

In the case of the present example, the insulation layer 33 is an ESTI (Extremely Shallow Trench Isolation) which is formed in the channel length direction in the diffusion layer 26, 28 by inserting in the trench 30 a deposit of a silicon oxide film having a less film thickness than a silicon oxide film ($SiO_2$ film) that is used for the device isolation insulation film 22. The insulation layer 33 is provided so as to have a greater height than the surface of the P-type well 21 (the surface of the semiconductor substrate) (i.e. so as to project from the surface of the P-type well 21 (the surface of the semiconductor substrate)).

The width W1 of the insulation layer 33 in this example is not less than the thickness of the gate insulation film (oxide film) 23, and is, e.g. about 40 nm to 1 μm.

In this example, the insulation films 33 are provided in the channel length direction both between the gate electrode 24 and the contact wiring line 31 and between the gate electrode 24 and the contact wiring line 32. However, it is not necessary to provide the insulation films 33 both between the gate electrode 24 and the contact wiring line 31 and between the gate electrode 24 and the contact wiring line 32. The insulation films 33 may be provided at least between the gate electrode 24 and the contact wiring line 31 or between the gate electrode 24 and the contact wiring line 32.

<3. Voltage Transfer Operation of the Transfer Transistor (at the Time of a Write Operation)>

Figure 5:
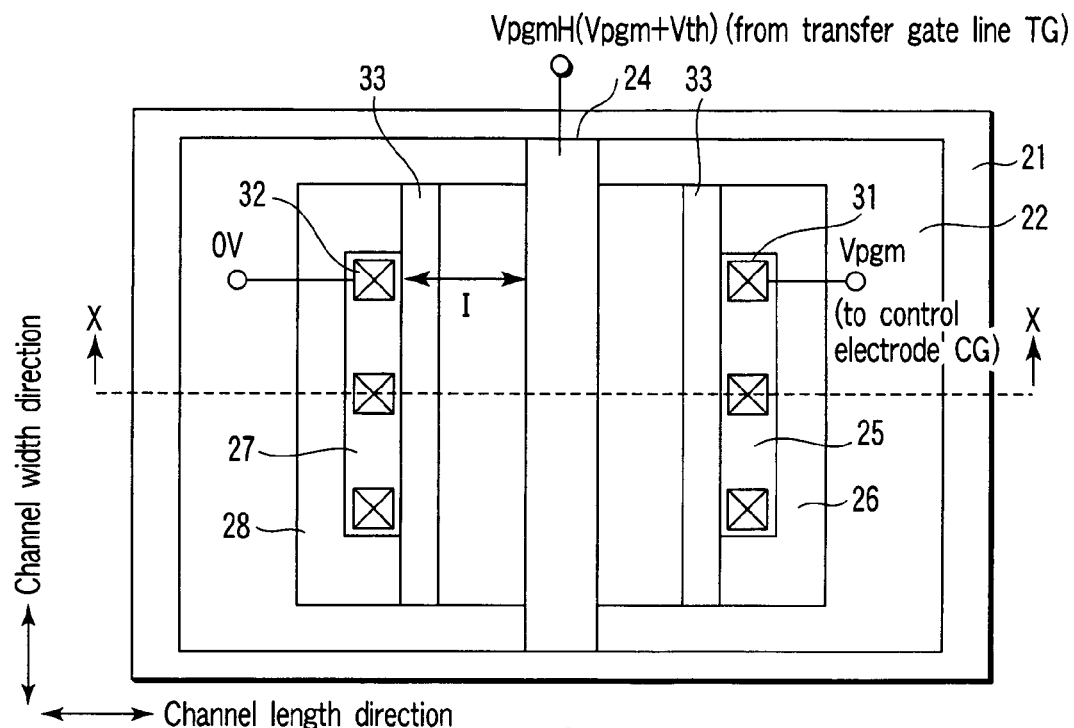
FIG. 5 is a plan view for explaining a voltage transfer operation of the transfer transistor shown in FIG. 2.
Figure 6:
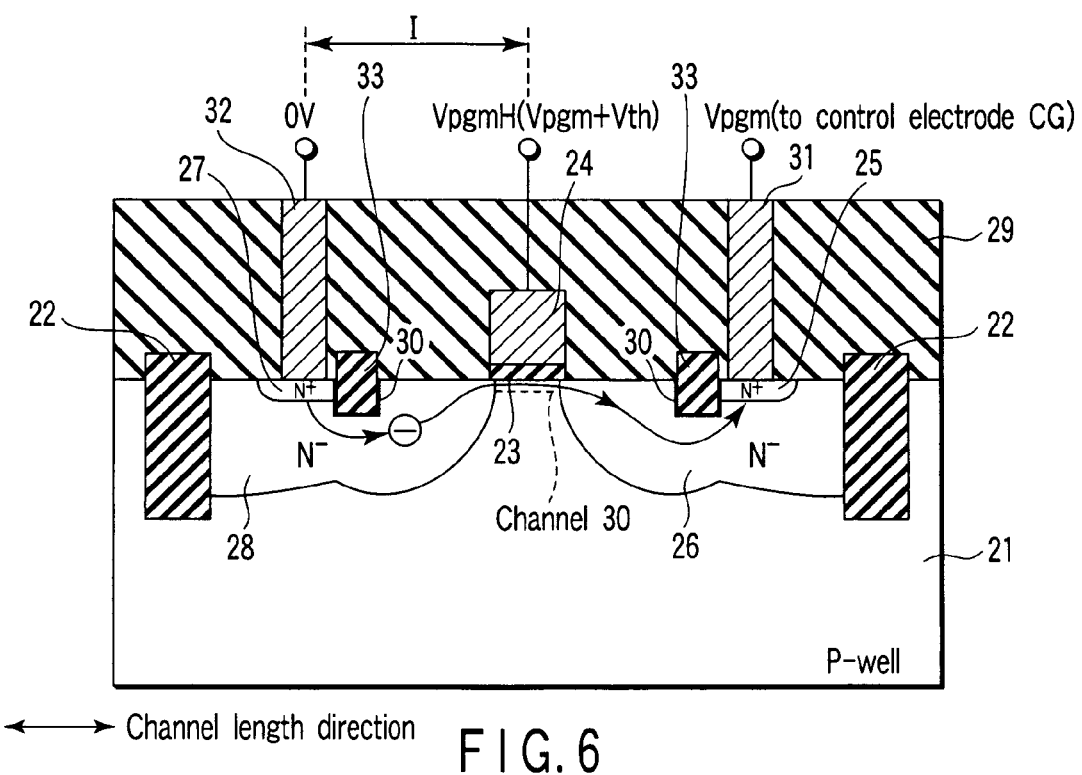
FIG. 6 is a cross-sectional view for explaining the voltage transfer operation of the transfer transistor shown in FIG. 2.

Next, referring to FIG. 5 and FIG. 6, the voltage transfer operation of the transfer transistor TR is described. FIG. 5 is a plan view for explaining the voltage transfer operation of the transfer transistor according to this embodiment, and FIG. 6 is a cross-sectional view taken along line X-X in FIG. 5. For example, a description is given of a case in which the transfer transistor TR0 transfers a write voltage Vpgm to memory cell transistors MT.

The relationship in bias voltages at the time of the write operation is as shown in the Figures.

To start with, a reference voltage (e.g. about 0 V) is applied via the contact wiring line 32 to the diffusion layer 28 functioning as the source, and a write voltage Vpgm (e.g. about 25 V) is applied via the contact wiring line 31 to the diffusion layer 26 functioning as the drain.

Subsequently, a potential VpgmH (Vpgm+Vth, e.g. about 26 V), which is supplied from the transfer gate line TG in order to transfer the write voltage Vpgm to the word line WL0, is applied to the gate electrode 24.

Then, a channel 30 forms in the P-type well 21 under the gate electrode 24, and a current path is formed. Carriers (electrons) move from the diffusion layer 28 to the diffusion layer 26, and the transfer transistor TR0 is turned on. A desired write voltage Vpgm is transferred to the word line WL0 (select word line).

The transfer transistor TR0 includes the insulation layers (ESTI in this example) 33 that are provided in the trenches 30. Thus, as shown in the Figures, at the time of the transfer operation, the insulation layers 33 can barrier the movement of carriers in the vicinity of the insulation layers 33. The carriers move from the surface of the P-type well 21 to regions deeper than the diffusion layers 26 and 28 so as to detour around the insulation layers 33. Accordingly, the surface breakdown voltage in the vicinity of the insulation layers 33 can be reduced. As a result, the distance I between the contact wiring line 31, 32 and the gate electrode 24 can be decreased.

Subsequently, the write operation in the memory cell transistors MT is performed by the write voltage Vpgm that is transferred to the word line WL. Specifically, a high voltage of, e.g. about 15 V to 30 V is applied to the word line WL and bit line BL, and electrons occurring in the vicinity of the drain become able to tunnel a potential barrier. Thus, the electrons flow into the floating gate FG, and the threshold voltage for the current can be raised.

On the other hand, in the memory cell transistors MT in which no electrons are injected in the floating gates FG, the threshold voltage for the current is lowered. According to the principle in which electric current flows and does not flow due to the difference in magnitude of the threshold voltage, the data read of memory cell transistors MT is executed in units of a page. In addition, at the time of the erase operation, a voltage of, e.g. about 15 V to 30 V is applied to the control electrode CG and a voltage of about 0 V is applied to the drain, and the electrons stored in the floating gates FG are drawn into the substrate by the tunnel effect. Thereby, data erase is executed batchwise in units of a block (Block).

<4. Advantageous Effects of the Semiconductor Device According to the Present Embodiment>

According to the above-described semiconductor device of this embodiment, at least the following advantageous effects (1) to (3) can be obtained.

(1) The surface breakdown voltage and the junction breakdown voltage can be improved, and microfabrication can advantageously be achieved.

As described above, the transfer transistor according to this embodiment includes the insulation layers 33 which are provided so as to have a greater depth in the P-type well 21 than the diffusion layers (N+ layers) 25 and 27 and to have a less depth in the P-type well 21 than the diffusion layers (N− layers) 26 and 28, and are provided in trenches 30 which are disposed in the channel length direction between the gate electrode 24 and the contact wiring line 31, 32.

Thus, as shown in FIG. 6, at the time of the transfer operation, the insulation layers 33 can barrier the movement of carriers in the vicinity of the insulation layers 33. Thereby, the carriers move from the surface of the P-type well 21 to regions deeper than the diffusion layers 26 and 28 so as to detour around the insulation layers 33. Accordingly, the surface breakdown voltage in the vicinity of the insulation layers 33 can be reduced. As a result, the range I between the contact wiring line 31, 32 and the gate electrode 24 can be decreased, and microfabrication can advantageously be achieved.

Furthermore, the insulation layer 33 is provided in the P-type well 21 at a position deeper than the diffusion layer (N+ layer) 25, 27. Thus, even at the time of high voltage application in the transfer operation, the junction breakdown voltage at the interface between the diffusion layer (N⁺ layer) 25, 27 and the diffusion layer (N⁻ layer) 26, 28 can be decreased. As a result, the range I between the contact wiring line 31, 32 and the gate electrode 24 can be decreased, and microfabrication can advantageously be achieved.

On the other hand, in the conventional semiconductor device, in order to increase the junction breakdown voltage, the breakdown voltage is increased by employing diffusion layers (N⁻ layers) with a low concentration of impurities that are implanted. However, if the concentration of implanted impurities is extremely decreased, the back-bias effect decreases and the performance of the high-breakdown-voltage transistor cannot be exhibited.

In addition, the ratio of the area, which is occupied by the high-breakdown-voltage transistor, such as the transfer transistor TR of the present embodiment, in the entire area of the NAND flash memory 11, is large. Therefore, the fact that the row decoder 16 is advantageous for microfabrication, as in the present embodiment, is a merit for reduction of the entire cell area of the NAND flash memory.

For example, in the present embodiment, the range I (active area space) between the contact wiring line 31, 32 and the gate electrode 24 can be set at about 0.32 μm, and the size of the device isolation insulation film 22 in the channel length direction can be set at about 0.15 μm. Therefore, the size in total is as follows:

0.32+0.15+0.32+0.15+0.32=about 1.26 μm.

As a result, reduction in size can be realized, for example, by a difference (about 0.26 μm) between the size of the distance of about 1.5 μm in the case where the insulation layers 33 are not provided, and the size of 1.26 μm.

(2) Leak of carriers from the contact wiring line 31, 32 can be prevented.

The insulation layer 33 is provided so as to have a greater height than the surface of the P-type well 21 (the surface of the semiconductor substrate) (i.e. so as to project from the surface of the P-type well 21 (the surface of the semiconductor substrate)).

Thereby, as shown in FIG. 6, an electric field occurring from the contact wiring line 31, 32 to the surface of the P-type well (semiconductor substrate) 21 at the time of the write operation can be barriered, and leak of carriers from the contact wiring line 31, 32 can advantageously be prevented.

(3) The manufacturing cost can advantageously be reduced.

The insulation layers 33 are provided so as to have a greater depth in the P-type well 21 than the diffusion layers (N⁺ layers) 25 and 27 and to have a less depth in the P-type well 21 than the diffusion layers (N⁻ layers) 26 and 28, and are provided in trenches 30 which are disposed in the channel length direction between the gate electrode 24 and the contact wiring line 31, 32.

No insulation layer 33 is provided in a range (II) between the diffusion layer 25, 27 and the device isolation insulation film 22 in the channel length direction in FIG. 3, or in a range (III) between the diffusion layer 25, 27 and the device isolation insulation film 22 in the gate width direction. The insulation layer 33 is provided only in a range (I) between the gate electrode 24 and the contact wiring line 31, 32. Therefore, a complex photomask for forming trenches is needless, and the manufacturing cost can advantageously be reduced.

The structure of this example is advantageous in the case where the distance of the range II, III is less than the width of the insulation layer 33 and the insulation layer (ESTI) 33 cannot be formed.

Second Embodiment

An Example in which Two Insulation Layers are Provided

Next, a semiconductor device according to a second embodiment of the invention is described with reference to FIG. 7 and FIG. 8. The second embodiment relates to an example in which two insulation layers (ESTI) are provided. A detailed description of the parts common to those in the first embodiment is omitted here.

Figure 7:
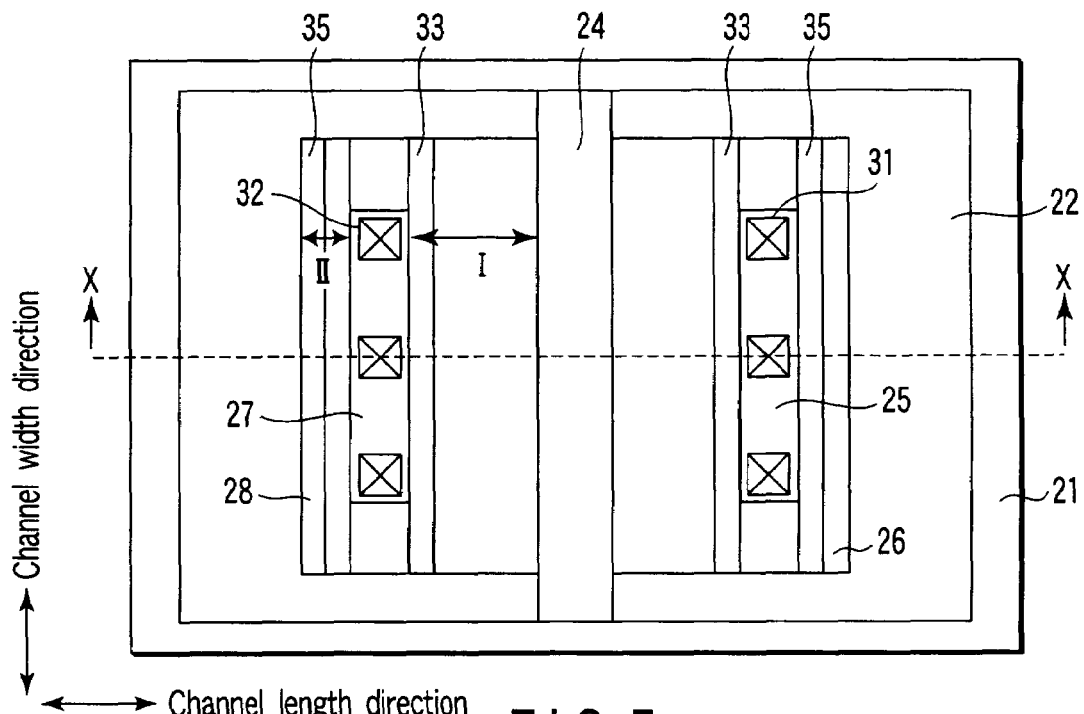
FIG. 7 is a plan view showing a semiconductor device according to a second embodiment of the invention.
Figure 8:
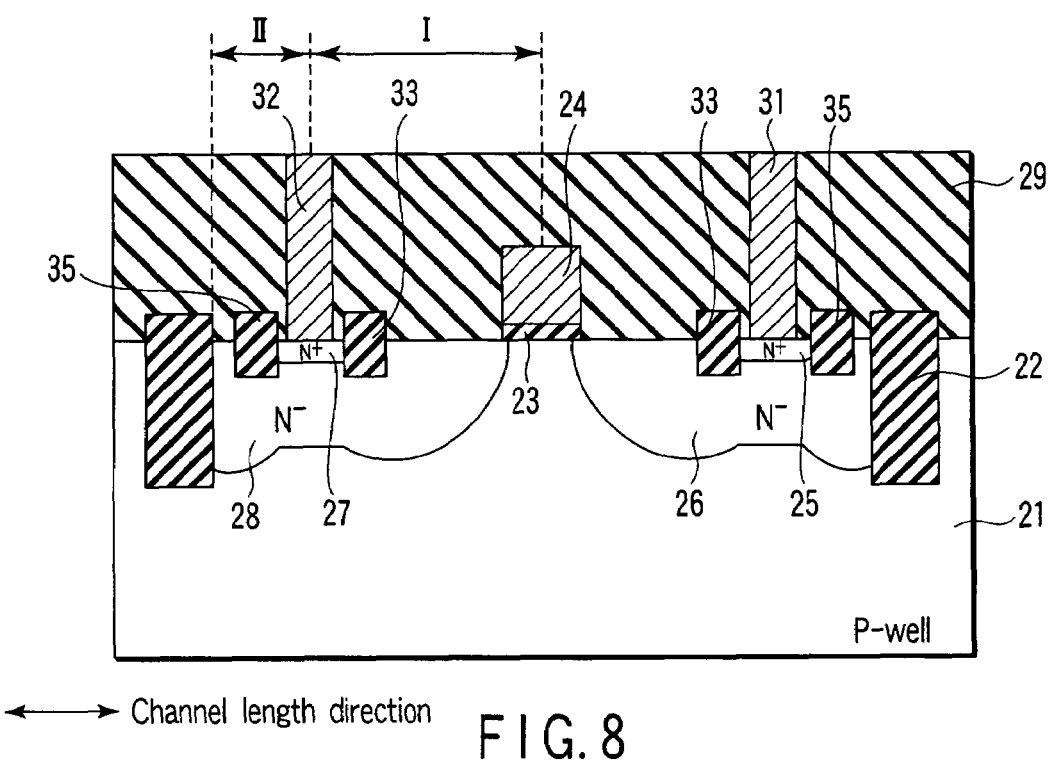
FIG. 8 is a cross-sectional view taken along line X-X in FIG. 7.

As shown in FIG. 7 and FIG. 8, the semiconductor device of the second embodiment differs from that of the first embodiment in that an insulation layer (ESTI) 35 is further provided in the range (II) between the diffusion layer 25, 27 and the device isolation insulation film 22 in the channel length direction.

According to the semiconductor device of this embodiment, at least the same advantageous effects (1) and (2) as described above can be obtained.

Furthermore, the semiconductor device of this embodiment includes the insulation layer (ESTI) 35 that is provided in the range II between the diffusion layer 25, 27 and the device isolation insulation film 22 in the channel length direction. Accordingly, at the time of the voltage transfer operation, the surface breakdown voltage and the junction breakdown voltage can be reduced in the range II between the diffusion layer 25, 27 and the device isolation insulation film 22 in the channel length direction. Therefore, microfabrication can more advantageously be achieved since the distance of the range II between the diffusion layer 25, 27 and the device isolation insulation film 22 in the channel length direction, as well as the distance of the range I between the contact wiring line 31, 32 and the gate electrode 24, can be decreased.

Third Embodiment

An Example Including an Insulation Layer that is Provided so as to Surround a Contact Wiring Line Next, a semiconductor device according to a third embodiment of the invention is described with reference to FIG. 9 and FIG. 10. The third embodiment relates to an example including an insulation layer 39 that is provided so as to surround the contact wiring line 31, 32. A detailed description of the parts common to those in the first embodiment is omitted here.

<Example of Structure>

Figure 9:
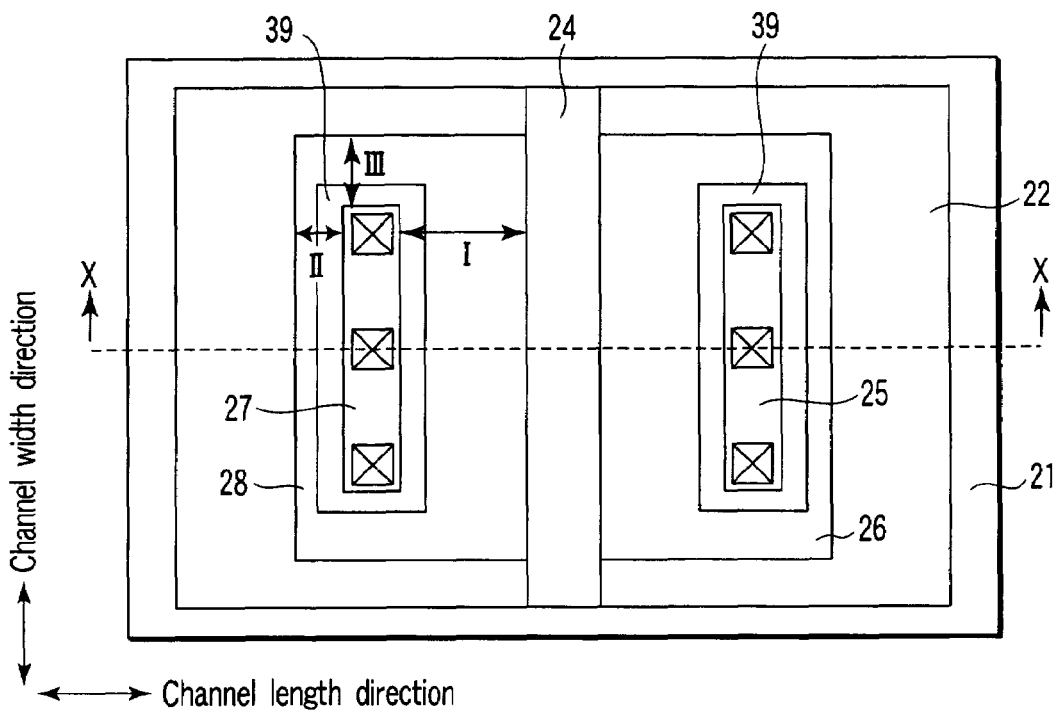
FIG. 9 is a plan view showing a semiconductor device according to a third embodiment of the invention.
Figure 10:
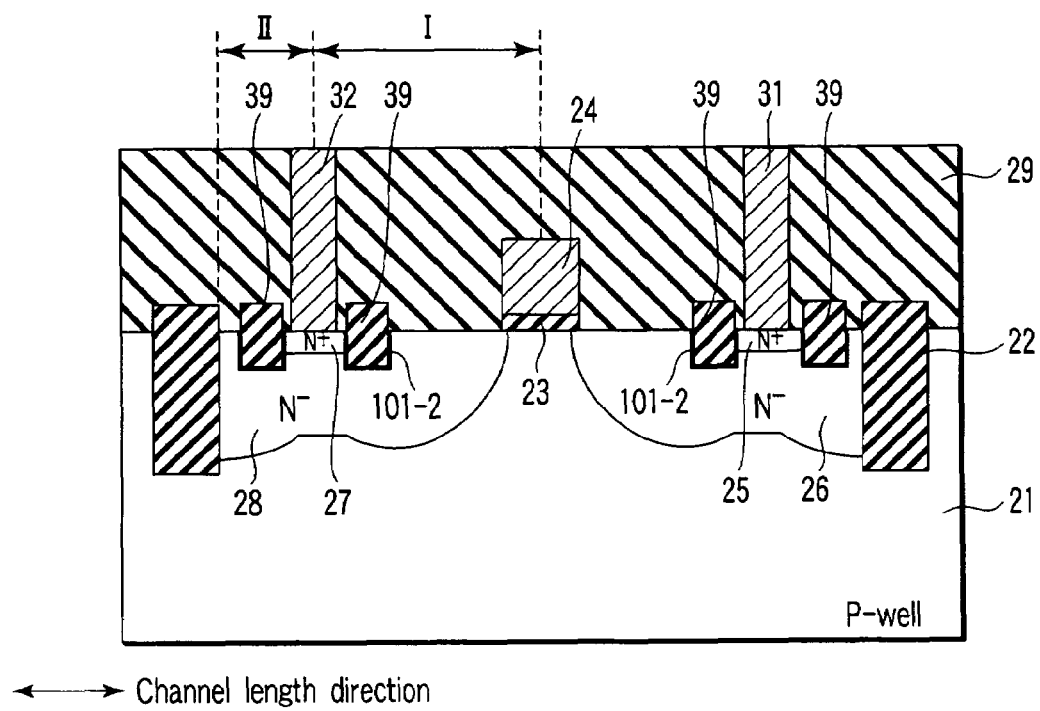
FIG. 10 is a cross-sectional view taken along line X-X in FIG. 9.

As shown in FIG. 9 and FIG. 10, the third embodiment differs from the first embodiment in that the semiconductor device of the third embodiment includes insulation layers 39 which are provided so as to surround the contact wiring lines 31 and 32.

The insulation layers 39 are provided so as to have a greater depth in the P-type well 21 than the diffusion layers (N⁺ layers) 25 and 27 and to have a less depth in the P-type well 21 than the diffusion layers (N⁻ layers) 26 and 28, and are provided in trenches 101-2 which are disposed so as to surround the contact wiring lines 31 and 32. In the case of this embodiment, too, the insulation layer 39 is an ESTI (Extremely Shallow Trench Isolation) which is formed by inserting in the trench 101-2 a deposit of a silicon oxide film having a less film thickness than a silicon oxide film ($SiO_2$ film) that is used for the device isolation insulation film 22.

<Fabrication Method>

Next, referring to FIG. 11 to FIG. 21, a method of fabricating the semiconductor device of this embodiment is described.

To start with, as shown in FIG. 11, a silicon oxide ($SiO_2$) film 102 is formed, for example, by thermal oxidation, on a P-type silicon substrate 100 or a P-well well that is formed in the silicon substrate. On the silicon oxide film 102, a silicon nitride (SiN) film 103 is formed, for example, by CVD (Chemical Vapor Deposition). In this fabrication step, an $SiO_2$—SiN pad is formed.

Subsequently, a photoresist is coated on the silicon nitride (SiN) film 103. The photoresist is subjected to exposure and development, thereby forming a pattern having openings in regions which become device isolation regions. As shown in FIG. 12, using the photoresist with the pattern as a mask, anisotropic etching, such as RIE (Reactive Ion Etching), is performed on the P-type silicon substrate 100, and trenches 101-1 are formed.

Figure 13:
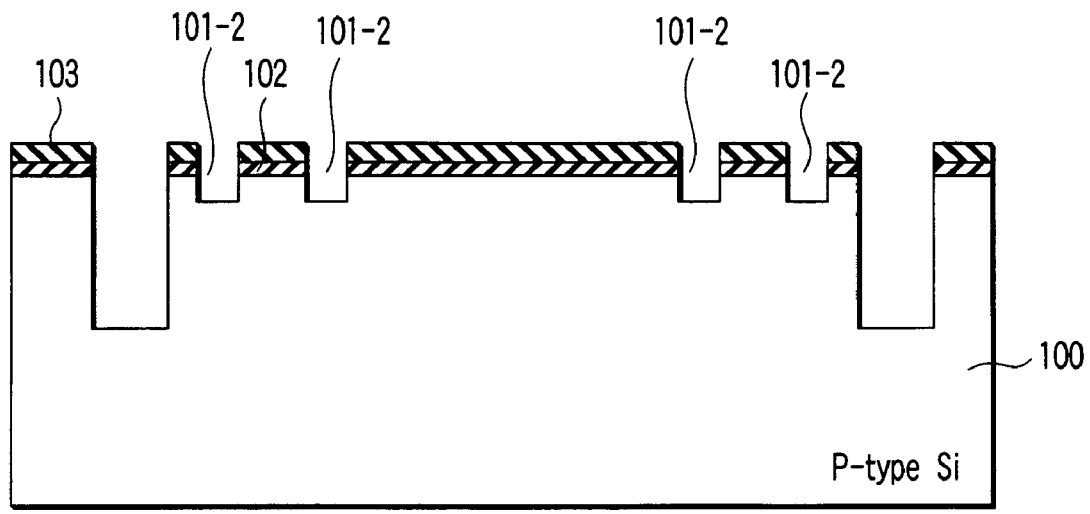
FIG. 13 is a cross-sectional view illustrating a fabrication step of the semiconductor device according to the third embodiment.

Subsequently, as shown in FIG. 13, anisotropic etching is similarly performed on the P-type silicon substrate 100 at regions where insulation layers 39 are to be formed. Thereby, trenches 101-2 are formed. In this anisotropic etching step, the trenches 101-2 are formed to be shallower than the trenches 101-1 in such a manner that the trenches 101-2 have a greater depth in the P-type well 21 than diffusion layers ($N^+$ layers) 25 and 27 and have a less depth in the P-type well 21 than diffusion layers ($N^-$ layers) 26 and 28. For this purpose, the application voltage for this anisotropic etching is chosen to be lower than the application voltage for the above-described anisotropic etching step (FIG. 12).

Figure 14:
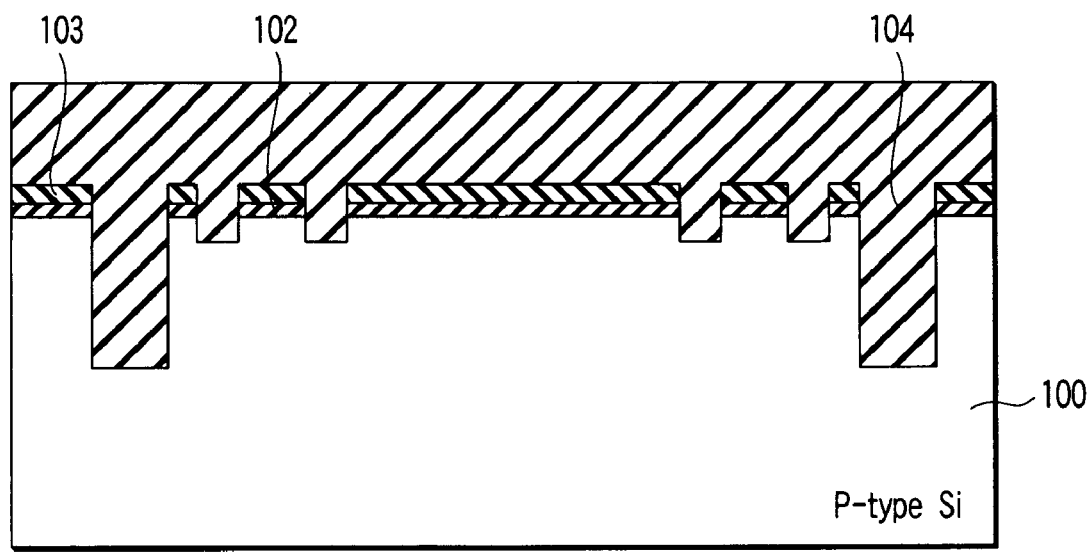
FIG. 14 is a cross-sectional view illustrating a fabrication step of the semiconductor device according to the third embodiment.

Then, as shown in FIG. 14, a silicon oxide film 104 is formed, for example, by CVD, on the substrate 100 in which the trenches 101-1 and 101-2 have been formed.

As shown in FIG. 15, the silicon oxide film 104 is subjected to, e.g. CMP (Chemical Mechanical Polishing) and is planarized at a level of the surface of the silicon nitride film 103. Thus, the silicon oxide film 104 is buried in the trenches 101-1 and 101-2, and device isolation insulation films 22 and insulation layers 39 are formed.

Thereafter, as shown in FIG. 16, the silicon nitride film 103 is removed, for example, by wet etching.

Further, as shown in FIG. 17, the silicon oxide film 102 is removed, for example, by wet etching.

Subsequently, as shown in FIG. 18, using a well-known fabrication step, a gate insulation film 23 is formed on the substrate 100, and a gate electrode 24 is formed on the gate insulation film 23.

As shown in FIG. 19, using the gate electrode 24 and insulation layers 35 as a mask, N-type impurities, such as phosphorus (P) or arsenic (As), are doped in the P-type silicon substrate 100, for example, by ion implantation. Thereby, diffusion layers ($N^-$ layers) 26 and 28 each functioning as a source/drain are formed.

Further, a photoresist is coated on the entire surface of the substrate 100, and a pattern for exposing only those portions of the diffusion layers 26 and 28, which are surrounded by the insulation layers 35, is formed on the photoresist. Subsequently, as shown in FIG. 20, using the photoresist as a mask, N-type impurities, such as phosphorus (P), are doped in the P-type silicon substrate 100, for example, by ion implantation. Thereby, diffusion layers ($N^+$ layers) 25 and 27 are formed. In this impurity doping step, application voltages, for instance, are selected so that the depth of the diffusion layer ($N^+$ layer) 25, 27 in the P-type well 21 may become less than that of the insulation layer 35 and that of the diffusion layer ($N^-$ layer) 26, 28.

Figure 21:
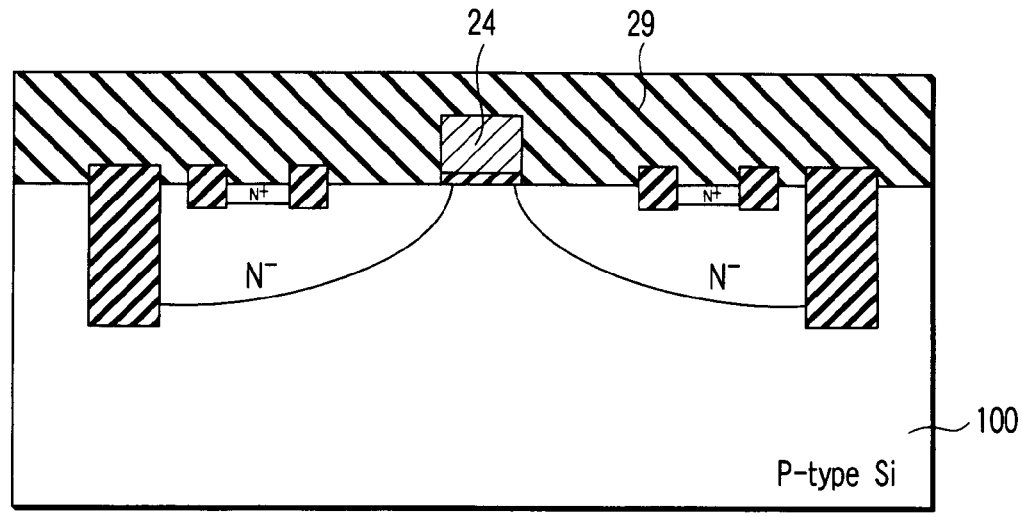
FIG. 21 is a cross-sectional view illustrating a fabrication step of the semiconductor device according to the third embodiment.

Following the above step, as shown in FIG. 21, a silicon oxide ($SiO_2$) film, for instance, is formed by, e.g. CVD, over the entire surface of the substrate 100, and thus an interlayer insulation film 29 is formed.

Subsequently, using a well-known fabrication step, contact holes are formed over the diffusion layer ($N^+$ layer) 25, 27. Polysilicon, for instance, is buried in the contact holes, and contact wiring lines 31 and 32 are formed.

Through the above fabrication steps, the semiconductor device according to this embodiment is fabricated.

<Advantageous Effects of the Semiconductor Device and the Fabrication Method Thereof According to the Present Embodiment>

With the above-described semiconductor device and the fabrication method thereof according to the present embodiment, at least the same advantageous effects (1) and (2) as described above can be obtained.

Furthermore, the semiconductor device of this embodiment includes the insulation layer 39 that is provided so as to surround the contact wiring line 31, 32. Thereby, at the time of the voltage transfer operation, the insulation layer 39 can barrier the movement of carriers in the vicinity of the insulation layer 39. Consequently, the carries move so as to detour around the insulation layer 39 from the surface of the P-type well 21 toward a deeper region of the diffusion layer 26, 28. Accordingly, the surface breakdown voltage and the junction voltage can be reduced in the vicinity of the insulation layer 39. As a result, the distance of the range I, II can be reduced, and microfabrication can advantageously be achieved.

In addition, since the insulation layer 39 is provided so as to surround the contact wiring line 31, 32, the surface breakdown voltage and the junction voltage can be improved in the range III between the contact wiring line 31, 32 and the device isolation insulation film 22 in the gate width direction. Therefore, the distance of the range III between the contact wiring line 31, 32 and the device isolation insulation film 22 in the gate width direction can advantageously be reduced.

Fourth Embodiment

An Example Further Including an Insulation Layer 41

Figure 22:
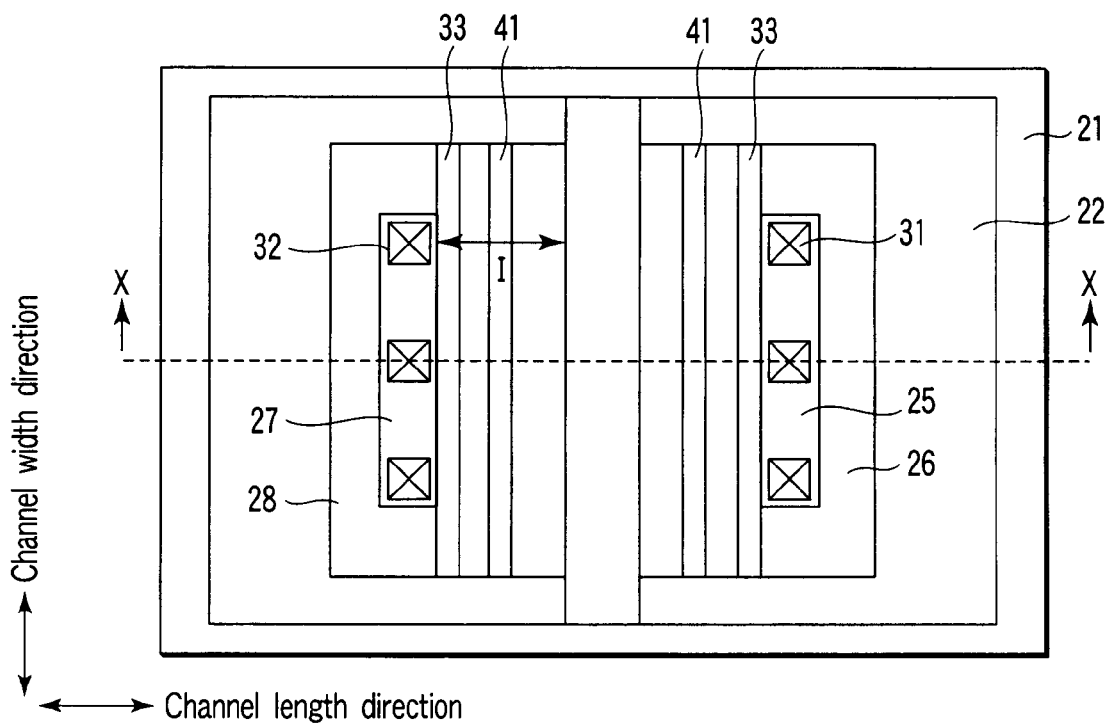
FIG. 22 is a plan view showing a semiconductor device according to a fourth embodiment of the invention.
Figure 23:
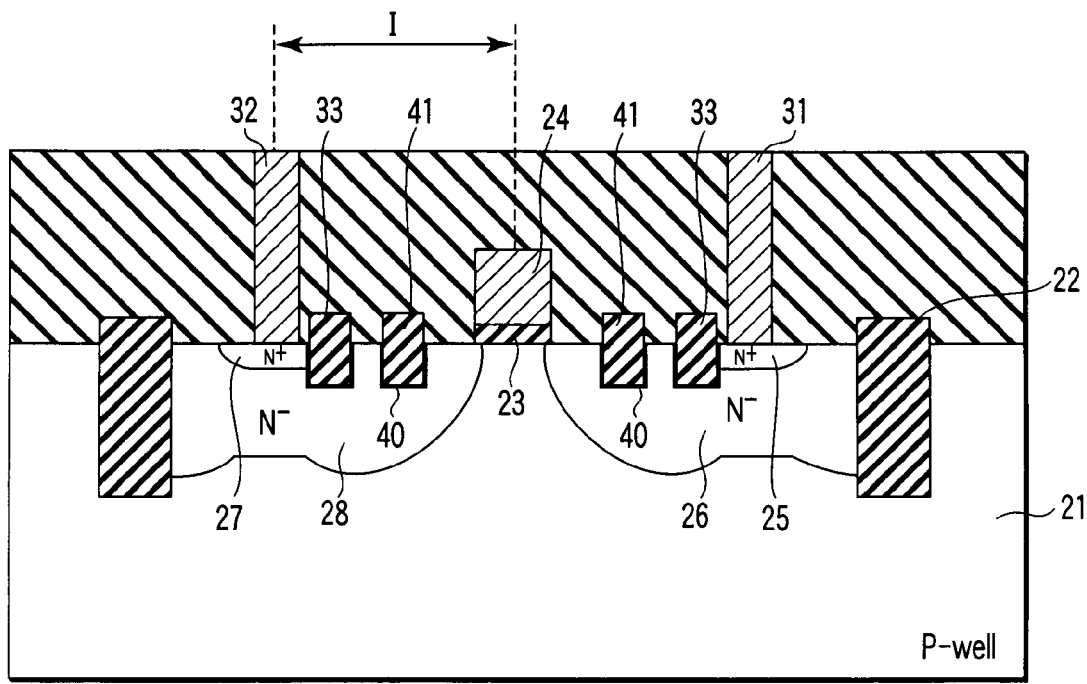
FIG. 23 is a cross-sectional view taken along line X-X in FIG. 22.

Next, referring to FIG. 22 and FIG. 23, a semiconductor device according to a fourth embodiment of the invention is described. The fourth embodiment relates to an example which further includes an insulation layer 41 between the contact wiring line 31, 32 and the gate electrode 24. A detailed description of the parts common to those in the first embodiment is omitted here.

As shown in FIG. 22 and FIG. 23, the semiconductor device of this embodiment differs from that of the first embodiment in that an insulation layer 41 is further provided in the range I between the contact wiring line 31, 32 and the gate electrode 24.

The insulation layer 41 is provided so as to have a greater depth in the P-type well 21 than the diffusion layer ($N^+$ layer) 25, 27 and to have a less depth in the P-type well 21 than the diffusion layer ($N^-$ layer) 26, 28, and is provided in a trench 40 which is disposed between the gate electrode 24 and the contact wiring line, 31, 32 in the channel length direction. In the case of this embodiment, too, the insulation layer 41 is an ESTI which is formed by insertion in the trench 40.

With the above-described semiconductor device according to the present embodiment, at least the same advantageous effects (1) and (2) as described above can be obtained.

Furthermore, the semiconductor device of this embodiment further includes the insulation layer 41 that is provided between the contact wiring line 31, 32 and the gate electrode 24. Thereby, at the time of the voltage transfer operation, the insulation layer 41 can barrier the movement of carriers in the vicinity of the insulation layer 41. Consequently, the carries move so as to detour around the insulation layer 41 toward a deeper region of the diffusion layer 26, 28. Accordingly, the surface breakdown voltage and the junction voltage can be reduced in the vicinity of the insulation layer 41, and the distance of the range I can advantageously be reduced.

Fifth Embodiment

An Example Further Including an Insulation Layer 42

Figure 24:
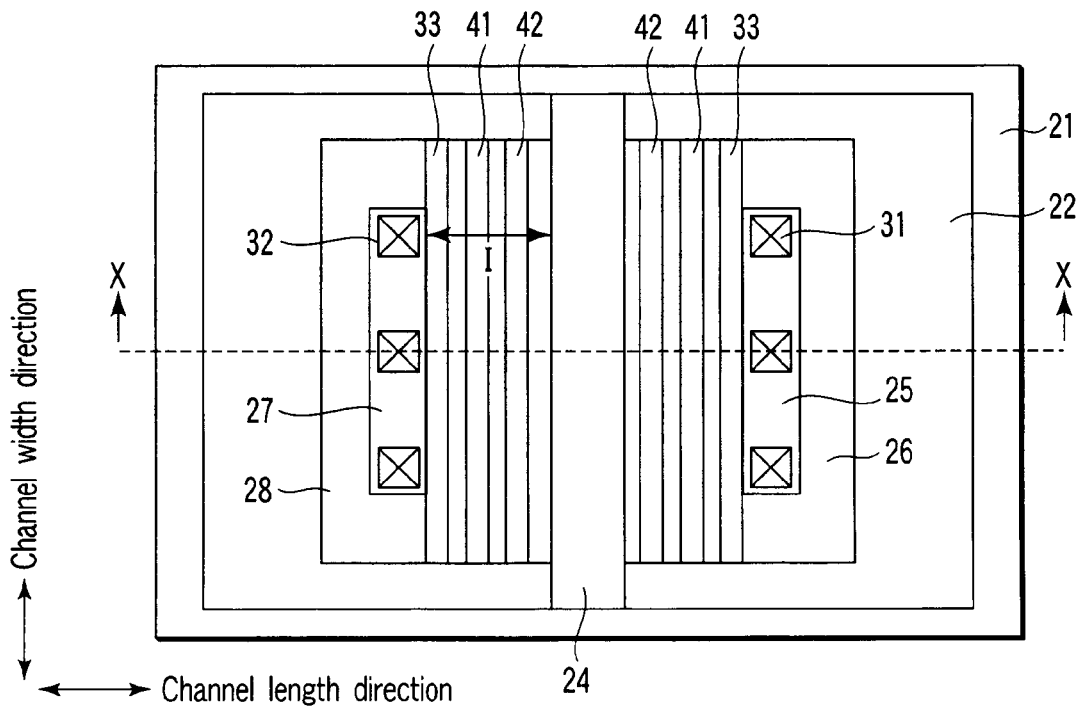
FIG. 24 is a plan view showing a semiconductor device according to a fifth embodiment of the invention.

Next, referring to FIG. 24, a semiconductor device according to a fifth embodiment of the invention is described. The fifth embodiment relates to an example which further includes insulation layers 42. A detailed description of the parts common to those in the fourth embodiment is omitted here.

As shown in FIG. 24, the semiconductor device of this embodiment differs from that of the fourth embodiment in that an insulation layer 42 is further provided in the range I between the contact wiring line 31, 32 and the gate electrode 24.

The insulation layer 42 is provided so as to have a greater depth in the P-type well 21 than the diffusion layer ($N^+$ layer) 25, 27 and to have a less depth in the P-type well 21 than the diffusion layer ($N^-$ layer) 26, 28, and is provided in a trench which is disposed between the gate electrode 24 and the contact wiring line, 31, 32 in the channel length direction. In the case of this embodiment, too, the insulation layer 42 is an ESTI which is formed by insertion in the trench.

With the above-described semiconductor device according to the present embodiment, at least the same advantageous effects (1) and (2) as described above can be obtained.

Furthermore, the semiconductor device of this embodiment further includes the insulation layer 42 that is provided between the contact wiring line 31, 32 and the gate electrode 24. Thereby, at the time of the voltage transfer operation, the insulation layer 42 can barrier the movement of carriers in the vicinity of the insulation layer 42. Consequently, the carries move so as to detour around the insulation layer 42 toward a deeper region of the diffusion layer 26, 28. Accordingly, the surface breakdown voltage and the junction voltage can be reduced in the vicinity of the insulation layer 42, and the distance of the range I can advantageously be reduced.

Sixth Embodiment

An Example Including a Wider Insulation Layer 45

Next, referring to FIG. 25 and FIG. 26, a semiconductor device according to a sixth embodiment of the invention is described. The sixth embodiment relates to an example which includes wider insulation layers 45. A detailed description of the parts common to those in the first embodiment is omitted here.

As shown in FIG. 25 and FIG. 26, the semiconductor device of this embodiment differs from that of the first embodiment in that an insulation layer 45 is provided in the range I between the contact wiring line 31, 32 and the gate electrode 24.

The insulation layer 45 is provided so as to have a greater depth in the P-type well 21 than the diffusion layer ($N^+$ layer) 25, 27 and to have a less depth in the P-type well 21 than the diffusion layer ($N^-$ layer) 26, 28, and is provided in a trench 44 which is disposed between the gate electrode 24 and the contact wiring line, 31, 32 in the channel length direction. In the case of this embodiment, too, the insulation layer 45 is an ESTI which is formed by insertion in the trench 44. In addition, the width W2 of the insulation layer 45 is greater than the width W1 of the above-described insulation layer 33. The width W2 of the insulation layer 45 is not less than the thickness of the gate insulation film (oxide film) 23, and is, e.g. about 50 nm to 1 µm.

With the above-described semiconductor device according to the present embodiment, at least the same advantageous effects (1) to (3) as described above can be obtained. The structure of this embodiment is applicable, where necessary.

Seventh Embodiment

An Example Including an Insulation Layer 46

Figure 27:
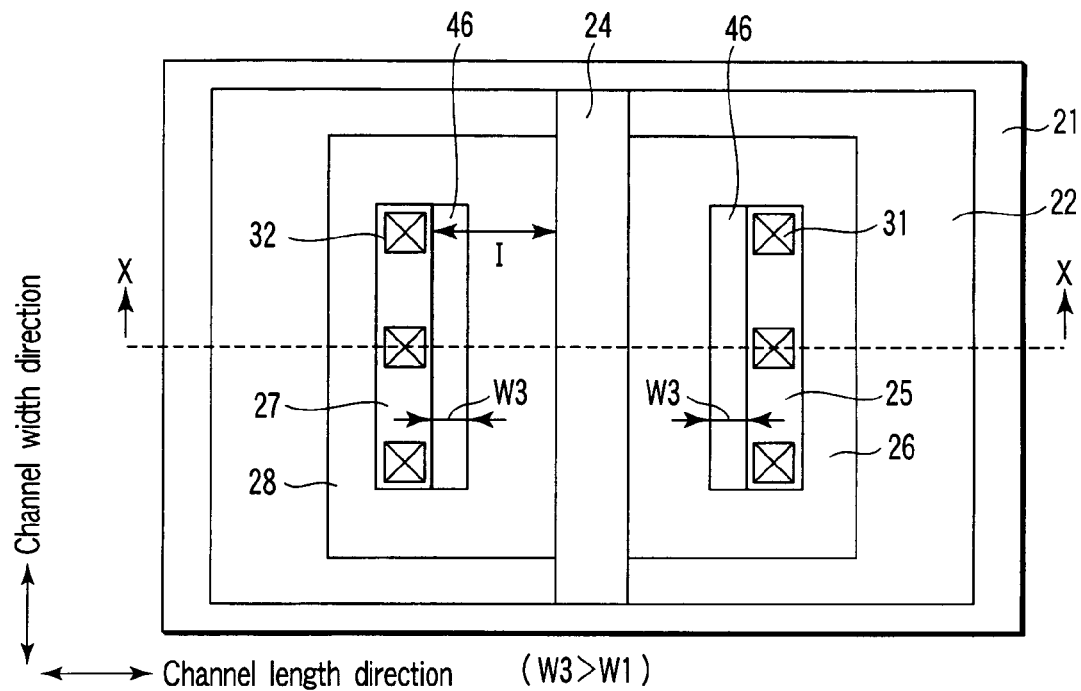
FIG. 27 is a plan view showing a semiconductor device according to a seventh embodiment of the invention.

Next, referring to FIG. 27, a semiconductor device according to a seventh embodiment of the invention is described. The seventh embodiment relates to an example which includes insulation layers 46. A detailed description of the parts common to those in the first embodiment is omitted here.

As shown in FIG. 27, the semiconductor device of this embodiment differs from that of the first embodiment in that an insulation layer 46 is provided in the range I between the contact wiring line 31, 32 and the gate electrode 24.

The length of the insulation layer 46 in the gate width direction is set to be substantially equal to that of the diffusion layer 25, 27. The width W3 of the insulation layer 46 is set to be greater than the width W1 of the above-described insulation layer (width: W3>W1).

With the above-described semiconductor device according to the present embodiment, at least the same advantageous effects (1) to (3) as described above can be obtained. The structure of this embodiment is applicable, where necessary.

Eighth Embodiment

An Example Including an Insulation Layer 47

Figure 28:
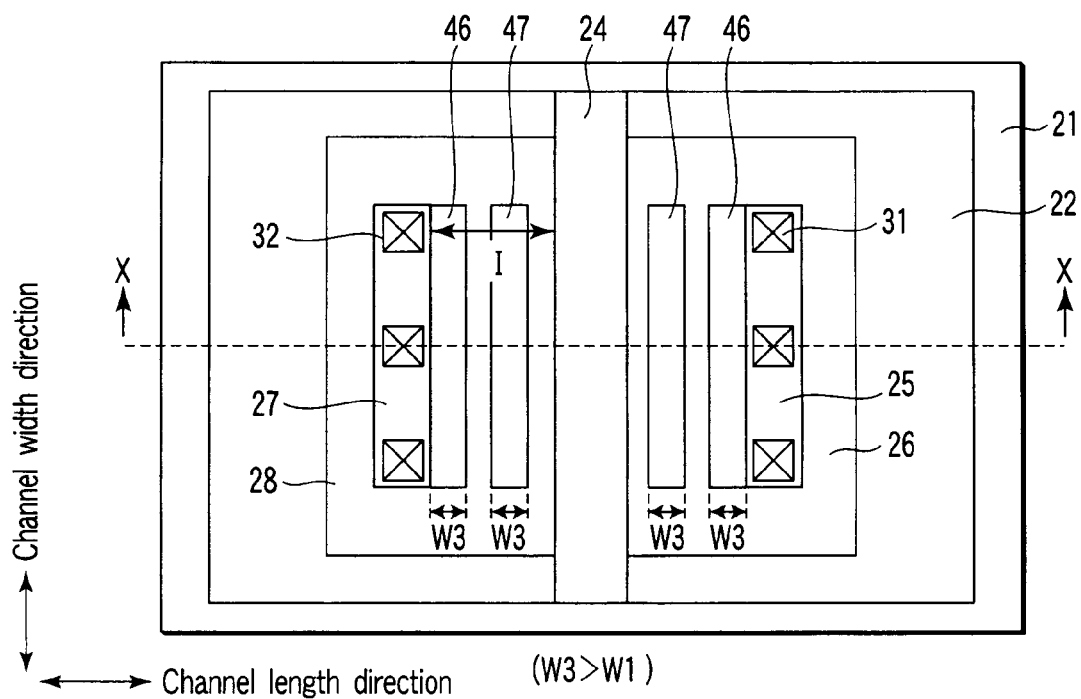
FIG. 28 is a plan view showing a semiconductor device according to an eighth embodiment of the invention.

Next, referring to FIG. 28, a semiconductor device according to an eighth embodiment of the invention is described. The eighth embodiment relates to an example which includes insulation layers 47. A detailed description of the parts common to those in the seventh embodiment is omitted here.

As shown in FIG. 28, the semiconductor device of this embodiment differs from that of the seventh embodiment in that an insulation layer 47 is provided in the range I between the contact wiring line 31, 32 and the gate electrode 24. The length of the insulation layer 47 in the gate width direction is set to be substantially equal to that of the insulation layer 46. The width W3 of the insulation layer 47 is set to be greater than the width W1 of the above-described insulation layer (width: W3>W1).

With the above-described semiconductor device according to the present embodiment, at least the same advantageous effects (1) and (2) as described above can be obtained. The structure of this embodiment is applicable, where necessary.

Ninth Embodiment

An Example Including an Insulation Layer 48

Next, referring to FIG. 29, a semiconductor device according to a ninth embodiment of the invention is described. The ninth embodiment relates to an example which includes insulation layers 48. A detailed description of the parts common to those in the seventh embodiment is omitted here.

As shown in FIG. 29, the semiconductor device of this embodiment differs from that of the seventh embodiment in that an insulation layer 48 is provided in the range II between the contact wiring line 31, 32 and the device isolation insulation film 22.

The length of the insulation layer 48 in the gate width direction is set to be substantially equal to that of the diffusion layer 25, 27. The width W3 of the insulation layer 46 is set to be greater than the width W1 of the insulation layer 48 (width: W3>W1).

With the above-described semiconductor device according to the present embodiment, at least the same advantageous effects (1) and (2) as described above can be obtained. The structure of this embodiment is applicable, where necessary.

Tenth Embodiment

An Example Including Insulation Layers 51 and 52

Next, referring to FIG. 30, a semiconductor device according to a tenth embodiment of the invention is described. The tenth embodiment relates to an example which includes insulation layers 51 and 52. A detailed description of the parts common to those in the seventh embodiment is omitted here.

As shown in FIG. 30, the semiconductor device of this embodiment differs from that of the seventh embodiment in that an insulation layer 51, 52 is provided in the range III between the contact wiring line 31, 32 and the device isolation insulation film 22 in the gate width direction.

With the above-described semiconductor device according to the present embodiment, at least the same advantageous effects (1) and (2) as described above can be obtained. The structure of this embodiment is applicable, where necessary.

Eleventh Embodiment

An Example Including Insulation Layers 33 and 55

Figure 31:
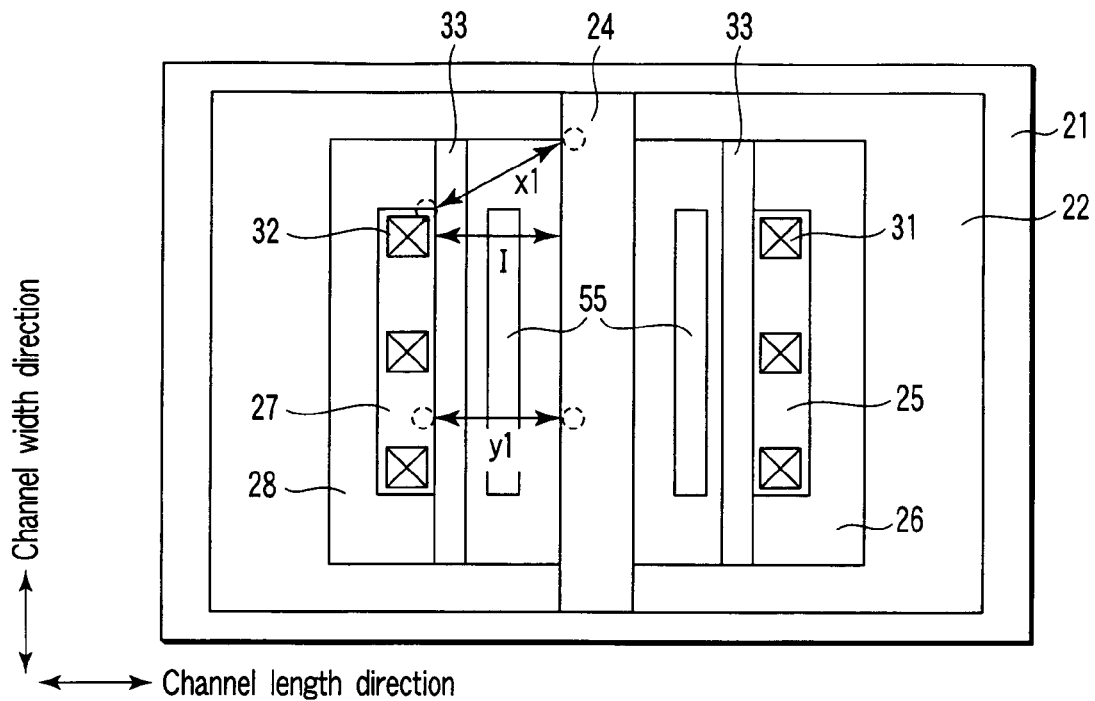
FIG. 31 is a plan view showing a semiconductor device according to an eleventh embodiment of the invention.

Next, referring to FIG. 31, a semiconductor device according to an eleventh embodiment of the invention is described. The eleventh embodiment relates to an example which includes insulation layers 33 and 55. A detailed description of the parts common to those in the first embodiment is omitted here.

As shown in FIG. 31, the semiconductor device of this embodiment differs from that of the first embodiment in that an insulation layer 55 is further provided in the range I between the contact wiring line 31, 32 and the gate electrode 24. The length of the insulation layer 55 in the gate width direction is substantially equal to that of the diffusion layer 25, 27.

With the above-described semiconductor device according to the present embodiment, at least the same advantageous effects (1) to (3) as described above can be obtained. The structure of this embodiment is applicable, where necessary.

In addition, the semiconductor device of this embodiment further includes the insulation layer 55 in the range I between the contact wiring line 31, 32 and the gate electrode 24. Accordingly, the insulation layers 33 and 55 are provided over a distance Y1 in which a highest voltage is applied, and only the insulation layer 33 is provided over a distance X1 in which a relatively low voltage is applied.

As a result, the effective distances relating to the surface breakdown voltages over the distances X1 and Y1 can be made equal, and the characteristics of the transfer transistor can advantageously be made uniform.

Twelfth Embodiment

An Example Including Insulation Layers 41 and 46

Figure 32:
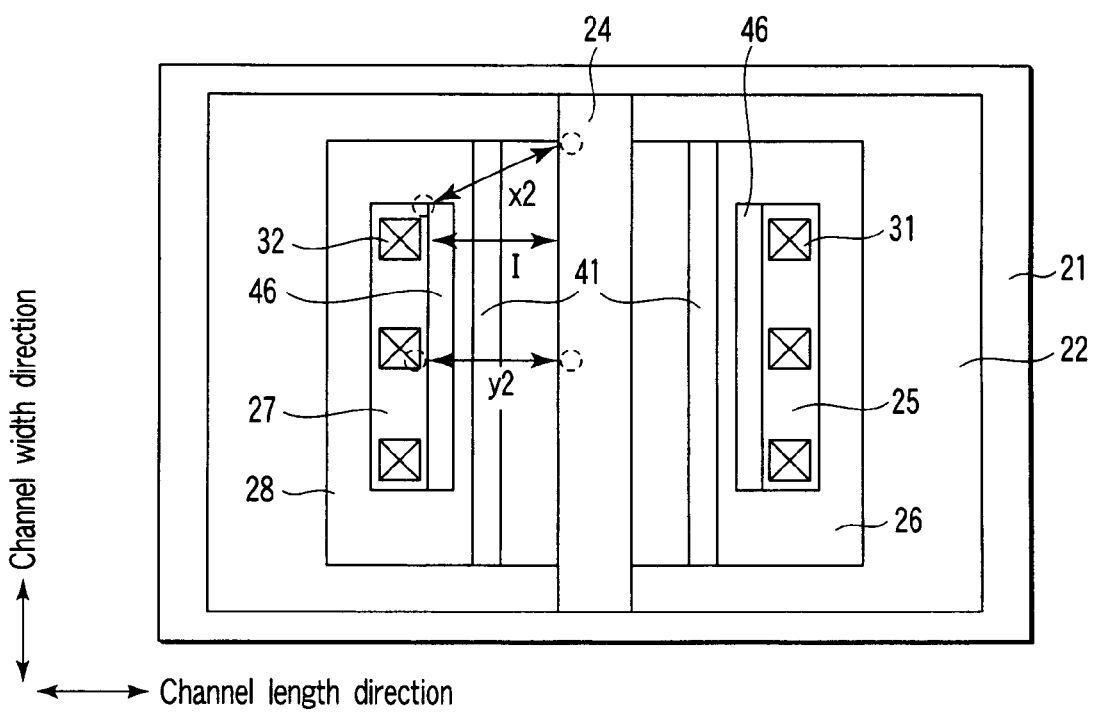
FIG. 32 is a plan view showing a semiconductor device according to a twelfth embodiment of the invention.

Next, referring to FIG. 32, a semiconductor device according to a twelfth embodiment of the invention is described. The twelfth embodiment relates to an example which includes insulation layers 41 and 46. A detailed description of the parts common to those in the first embodiment is omitted here.

As shown in FIG. 32, the semiconductor device of this embodiment differs from that of the first embodiment in that insulation layers 41 and 46 are provided in the range I between the contact wiring line 31, 32 and the gate electrode 24.

With the above-described semiconductor device according to the present embodiment, at least the same advantageous effects (1) to (3) as described above can be obtained. The structure of this embodiment is applicable, where necessary.

Furthermore, the semiconductor device of this embodiment includes the insulation layer 41 and 46 in the range I between the contact wiring line 31, 32 and the gate electrode 24. Accordingly, the insulation layers 41 and 46 are provided over a distance Y2 in which a highest voltage is applied, and only the insulation layer 41 is provided over a distance X2 in which a relatively low voltage is applied.

As a result, the effective distances relating to the surface breakdown voltages over the distances X2 and Y2 can be made equal, and the characteristics of the transfer transistor can advantageously be made uniform.

13th Embodiment

An Example Including Insulation Layers 39 and 55

Figure 33:
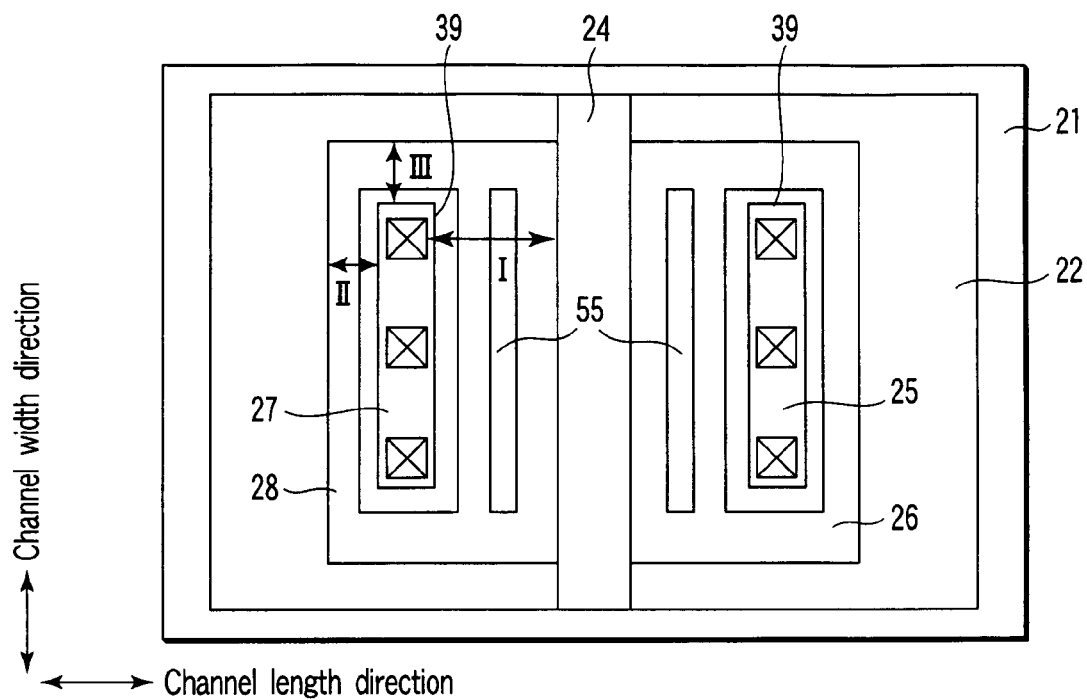
FIG. 33 is a plan view showing a semiconductor device according to a 13th embodiment of the invention.

Next, referring to FIG. 33, a semiconductor device according to a 13th embodiment of the invention is described. The 13th embodiment relates to an example which includes insulation layers 39 and 55. A detailed description of the parts common to those in the third embodiment is omitted here.

As shown in FIG. 33, the semiconductor device of this embodiment differs from that of the third embodiment in that insulation layers 39 and 55 are provided.

With the above-described semiconductor device according to the present embodiment, at least the same advantageous effect (1) as described above can be obtained. Moreover, compared to the third embodiment, the surface breakdown voltage in the range I between the contact wiring line 31, 32 and the gate electrode 24 can be more improved, and the distance of the range I can advantageously be made shorter.

14th Embodiment

An Example Including Insulation Layers 39 and 41

Figure 34:
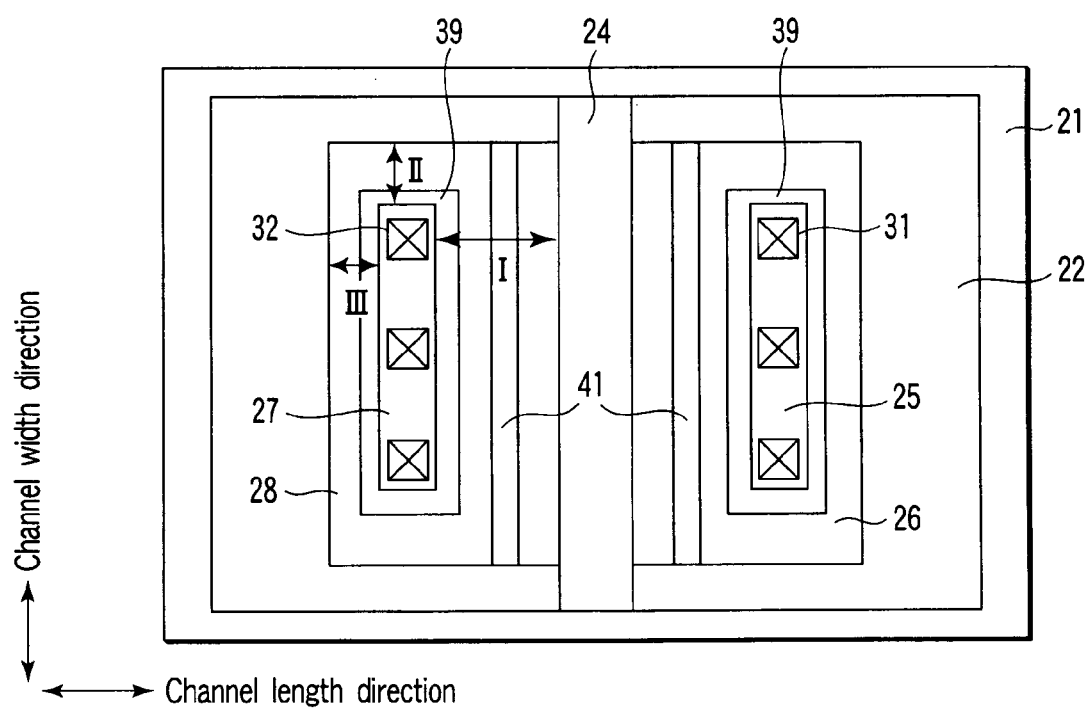
FIG. 34 is a plan view showing a semiconductor device according to a 14th embodiment of the invention.

Next, referring to FIG. 34, a semiconductor device according to a 14th embodiment of the invention is described. The 14th embodiment relates to an example which includes insulation layers 39 and 41. A detailed description of the parts common to those in the third embodiment is omitted here.

As shown in FIG. 34, the semiconductor device of this embodiment differs from that of the third embodiment in that insulation layers 39 and 41 are provided.

With the above-described semiconductor device according to the present embodiment, at least the same advantageous effects (1) and (2) as described above can be obtained. Moreover, compared to the third embodiment, the surface breakdown voltage in the range I between the contact wiring line 31, 32 and the gate electrode 24 can be more improved, and the distance of the range I can advantageously be made shorter.

15th Embodiment

An Example Including an Insulation Layer 39 Only on the Source Side

Figure 35:
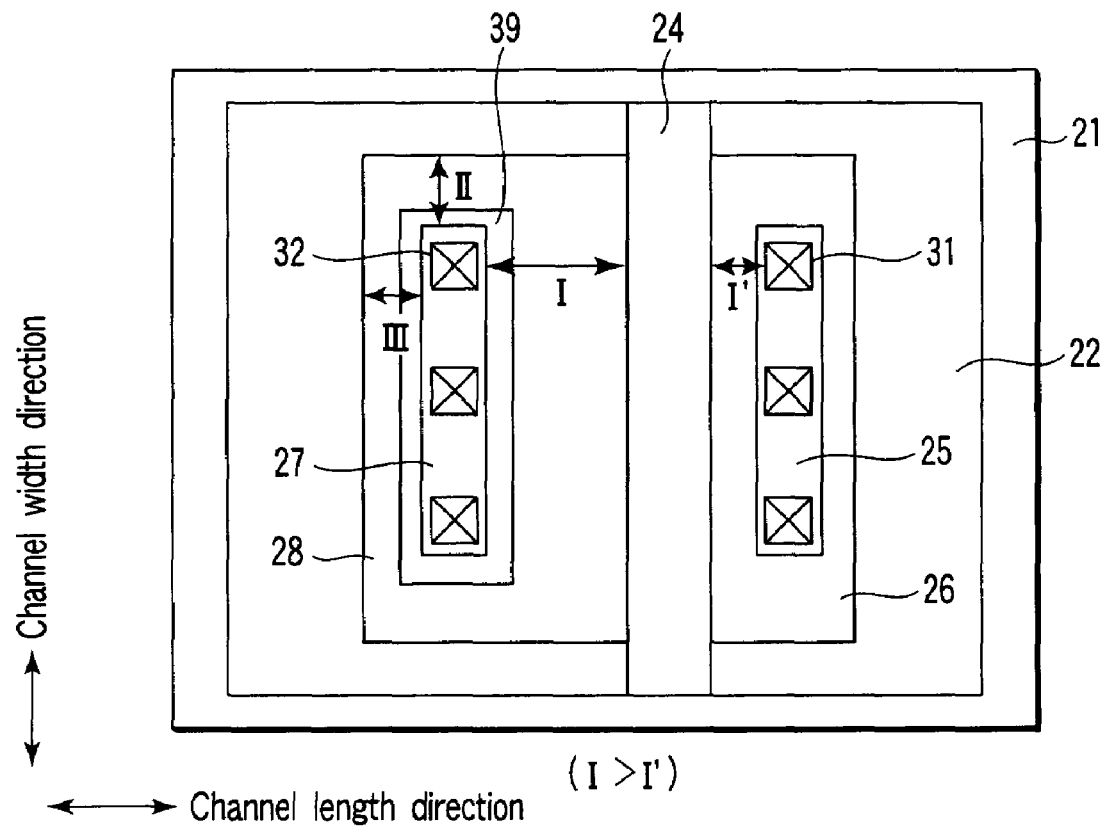
FIG. 35 is a plan view showing a semiconductor device according to a 15th embodiment of the invention.

Next, referring to FIG. 35, a semiconductor device according to a 15th embodiment of the invention is described. The 15th embodiment relates to an example which includes an insulation layer 39 only on the source side. A detailed description of the parts common to those in the third embodiment is omitted here. In the case of the present embodiment, for example, a fixed voltage is applied to the drain-side contact wiring line 31, and a varying high voltage is applied to the source-side contact wiring line 32.

As shown in FIG. 35, the semiconductor device of this embodiment differs from that of the third embodiment in that the insulation layer 39 is provided only on the source side.

The insulation layer 39 is provided in the P-side well so as to surround only the source-side contact wiring line 32.

In addition, the distance of the range I between the source-side contact wiring line 32 and the gate electrode 24 in the channel length direction is set to be greater than the distance of a range I' between the drain-side contact wiring line 31 and the gate electrode 24 (distance: I>I').

As described above, in the case where a fixed voltage is applied to the drain-side contact wiring line 31 and a varying high voltage is applied to the source-side contact wiring line 32, the distance of the range I is increased by providing the insulation layer 39 only on the side of the contact wiring line 32 to which the varying high voltage is applied.

Therefore, the surface breakdown voltage and junction breakdown voltage on the side of the contact wiring line 32, to which the varying high voltage is applied, can be improved, and the distance of the range I can be reduced.

On the other hand, since the distance of the range I' on the side of the contact wiring line 31, to which the fixed voltage is applied, is less than the distance of the range I, microfabrication can be realized.

As described above, the present embodiment is advantageous in the case where a high voltage is applied to only one of the source-side contact wiring line and the drain-side contact wiring line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising: a gate insulation film provided on a semiconductor substrate; a gate electrode provided on the gate insulation film; a pair of first diffusion layers which are provided in the semiconductor substrate in such a manner that the gate electrode is interposed between, and spaced apart from, the first diffusion layers;

a pair of second diffusion layers which are provided in the semiconductor substrate in such a manner that the gate electrode is interposed between the second diffusion layers, the second diffusion layers being provided in such a manner as to surround the first diffusion layers, respectively, and each of the second diffusion layers being formed to have a greater depth from a surface of the semiconductor substrate than the first diffusion layers and to have a lower impurity concentration than the first diffusion layers;

contact wiring lines provided on the first diffusion layers, respectively; a first insulation layer which is an insulation layer formed in at least one of the second diffusion layers between the gate electrode and the contact wiring lines, the first insulation layer having a greater depth in the semiconductor substrate than the first diffusion layer and a less depth than the second diffusion layer; and a second insulation layer which is an insulation layer formed in the second diffusion layer in such a manner that the first diffusion layer is interposed between the first insulation layer and the second insulation layer, the second insulation layer having a greater depth in the semiconductor substrate than the first diffusion layer and less depth than the second diffusion layer.

2. A semiconductor device comprising:

a gate insulation film provided on a semiconductor substrate;

a gate electrode provided on the gate insulation film;

a pair of first diffusion layers which are provided in the semiconductor substrate in such a manner that the gate electrode is interposed between, and spaced apart from, the first diffusion layers;

a pair of second diffusion layers which are provided in the semiconductor substrate in such a manner that the gate electrode is interposed between the second diffusion layers, the second diffusion layers being provided in such a manner as to surround the first diffusion layers, respectively, and each of the second diffusion layers being formed to have a greater depth from a surface of the semiconductor substrate than the first diffusion layers and to have a lower impurity concentration than the first diffusion layers;

contact wiring lines provided on the first diffusion layers, respectively;

a first insulation layer which is an insulation layer formed in at least one of the second diffusion layers between the gate electrode and the contact wiring lines, the first insulation layer having a greater depth in the semiconductor substrate than the first diffusion layer and a less depth than the second diffusion layer; and a second insulation layer which is an insulation layer formed in at least one of the second diffusion layers between the gate electrode and the first insulation layers, the second insulation layer having a greater depth in the semiconductor substrate than the first diffusion layer and a less depth than the second diffusion layer.

3. The device according to claim 1, wherein a height of the first insulation layer is greater than a height of the surface of the semiconductor substrate.

4. The device according to claim 1, wherein a width of the first insulation layer in a channel length direction is not less than a thickness of the gate insulation film.

5. The device according to claim 1, wherein the second insulation layer surrounds at least one of the contact wiring lines.

6. The device according to claim 5, wherein a length of the first insulation layer in a channel width direction being substantially equal to a length of the first diffusion layer in the channel width direction.

7. The device according to claim 2, further comprising a third insulation layer which is an insulation layer formed in at least one of the second diffusion layers between the gate electrode and the first insulation layer, the third insulation layer having a greater depth in the semiconductor substrate than the first diffusion layer and a less depth than the second diffusion layer.

8. The device according to claim 5, wherein a height of the first insulation layer is greater than a height of the surface of the semiconductor substrate.

9. The device according to claim 5, wherein a width of the first insulation layer in a channel length direction is not less than a thickness of the gate insulation film.

* * * * *